(12) United States Patent
Grigore

(10) Patent No.: US 7,653,366 B2
(45) Date of Patent: Jan. 26, 2010

(54) HYBRID SWITCHED MODE/LINEAR POWER AMPLIFIER POWER SUPPLY FOR USE IN POLAR TRANSMITTER

(75) Inventor: Vlad Gabriel Grigore, Vantaa (FI)

(73) Assignee: Nokia Corporation, Espoo (FI)

( * ) Notice: Subject to any disclaimer, the term of this patent is extended or adjusted under 35 U.S.C. 154(b) by 341 days.

(21) Appl. No.: 11/399,118

(22) Filed: Apr. 5, 2006

(65) Prior Publication Data
US 2006/0250825 A1    Nov. 9, 2006

Related U.S. Application Data

(62) Division of application No. 10/943,547, filed on Sep. 16, 2004, now Pat. No. 7,058,373.

(60) Provisional application No. 60/503,303, filed on Sep. 16, 2003.

(51) Int. Cl.
*H01Q 11/12* (2006.01)
*H04B 1/38* (2006.01)
*G05F 1/00* (2006.01)

(52) U.S. Cl. ............... 455/127.1; 455/572; 323/268; 323/273; 323/282

(58) Field of Classification Search ... 455/127.1–127.7, 455/108, 110, 572, 574; 323/266, 268, 273, 323/303, 350, 351; 330/10, 296, 297
See application file for complete search history.

(56) References Cited

U.S. PATENT DOCUMENTS

| | | | |
|---|---|---|---|
| 4,688,255 A | 8/1987 | Kahn | 381/16 |
| 4,727,308 A * | 2/1988 | Huljak et al. | 323/222 |
| 5,083,078 A | 1/1992 | Kubler et al. | 323/268 |
| 5,258,701 A | 11/1993 | Pizzi et al. | 323/269 |
| 5,629,608 A * | 5/1997 | Budelman | 323/268 |
| 5,864,225 A | 1/1999 | Bryson | 323/268 |
| 6,023,143 A | 2/2000 | Salina et al. | 318/599 |
| 6,049,707 A | 4/2000 | Buer et al. | 455/314 |
| 6,101,224 A | 8/2000 | Lindoff et al. | 375/268 |

(Continued)

OTHER PUBLICATIONS

Iwamoto, M. et al., "Bandpass delta-sigma class-S amplifier", Jun. 8, 2000, Electronics Letters, vol. 36, No. 12, pp. 1010-1012.
Raab, F. et al., "RF and Microwave Power Amplifier and Transmitter Technologies—Part 3", High Frequency Electronics, Sep. 2003, even pp. 34-42, 43 and even pp. 44-48.

*Primary Examiner*—Duc M Nguyen
(74) *Attorney, Agent, or Firm*—Harrington & Smith, PC

(57) ABSTRACT

In one aspect this invention provides a DC-DC converter that has a switch mode part for coupling between a DC source and a load, the switch mode part providing x amount of output power; and that further has a linear mode part coupled in parallel with the switch mode part between the DC source and the load, the linear mode part providing y amount of output power, where x is preferably greater than y, and the ratio of x to y may be optimized for particular application constraints. In a further aspect there is a radio frequency (RF) transmitter (TX) for coupling to an antenna, where the TX has a polar architecture having an amplitude modulation (AM) path coupled to a power supply of a power amplifier (PA) and a phase modulation (PM) path coupled to an input of the PA, where the power supply includes the switch mode part for coupling between a battery and the PA and the linear mode part coupled in parallel with the switch mode part between the battery and the PA.

24 Claims, 36 Drawing Sheets

U.S. PATENT DOCUMENTS

| | | | |
|---|---|---|---|
| 6,150,798 A | 11/2000 | Ferry et al. | 323/273 |
| 6,229,289 B1 | 5/2001 | Piovaccari et al. | 323/268 |
| 6,252,461 B1 | 6/2001 | Raab | 330/302 |
| 6,256,482 B1 | 7/2001 | Raab | 455/108 |
| 6,300,826 B1 | 10/2001 | Mathe et al. | 330/10 |
| 6,377,032 B1 | 4/2002 | Andruzzi et al. | 323/224 |
| 6,377,784 B2 | 4/2002 | McCune | 455/108 |
| 6,441,591 B2 * | 8/2002 | Nokkonen | 323/266 |
| 6,486,643 B2 * | 11/2002 | Liu | 323/268 |
| 6,636,023 B1 * | 10/2003 | Amin | 323/268 |
| 6,661,211 B1 | 12/2003 | Currelly et al. | 323/268 |
| 6,792,252 B2 | 9/2004 | Kimball et al. | 455/127.3 |
| 6,825,726 B2 | 11/2004 | French et al. | 330/297 |
| 6,864,668 B1 | 3/2005 | McCune et al. | 323/266 |
| 7,058,373 B2 * | 6/2006 | Grigore | 455/127.1 |
| 7,129,681 B2 * | 10/2006 | Fujii | 323/268 |
| 2002/0089316 A1 | 7/2002 | Liu | 323/268 |
| 2002/0177420 A1 | 11/2002 | Sander et al. | 455/108 |
| 2003/0086280 A1 | 5/2003 | Bourdillon | 363/21.12 |
| 2003/0160658 A1 | 8/2003 | Cioffi et al. | 330/297 |
| 2004/0183512 A1 | 9/2004 | McCune, Jr. | 323/282 |
| 2004/0183602 A1 | 9/2004 | Maunuksela et al. | 331/17 |
| 2004/0192369 A1 | 9/2004 | Nilsson | 455/522 |
| 2004/0208157 A1 | 10/2004 | Sander et al. | 370/345 |

* cited by examiner

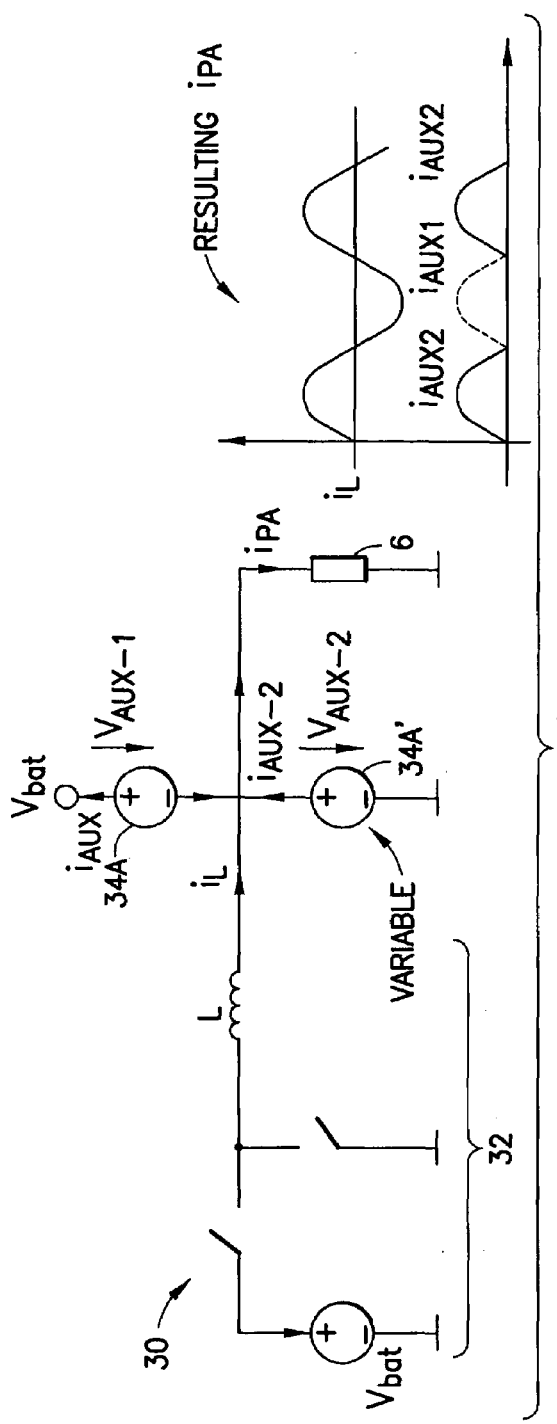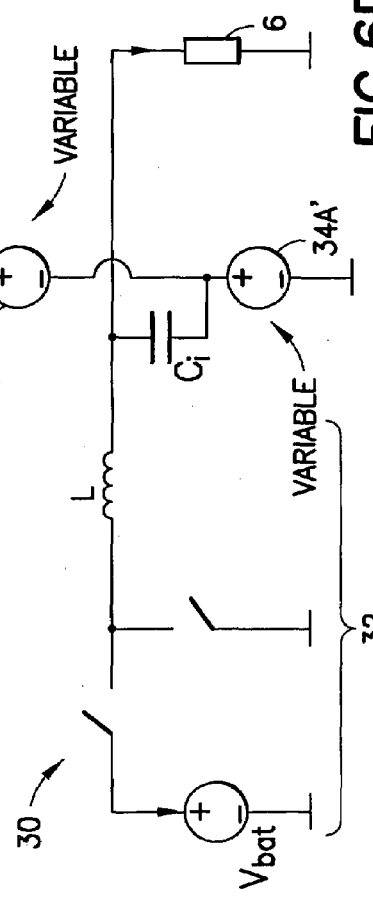
FIG.6C
FIG.6D

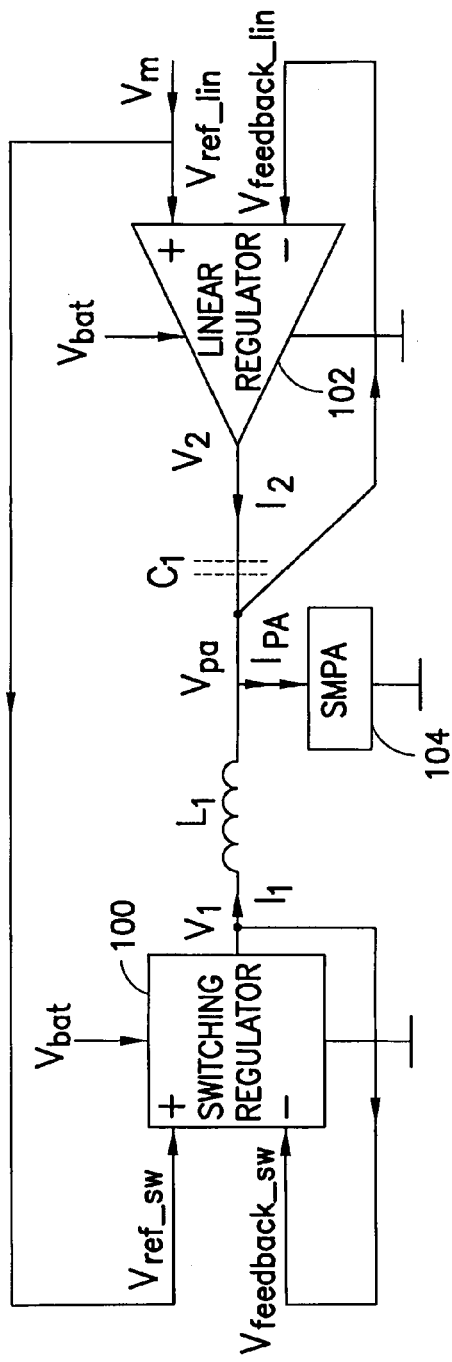
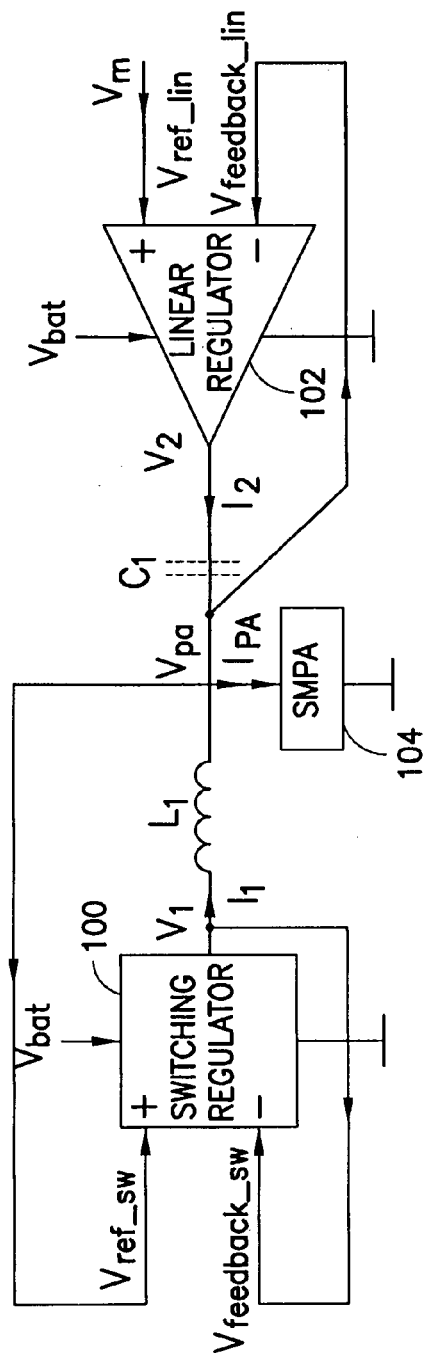
FIG.25A
FIG.25B

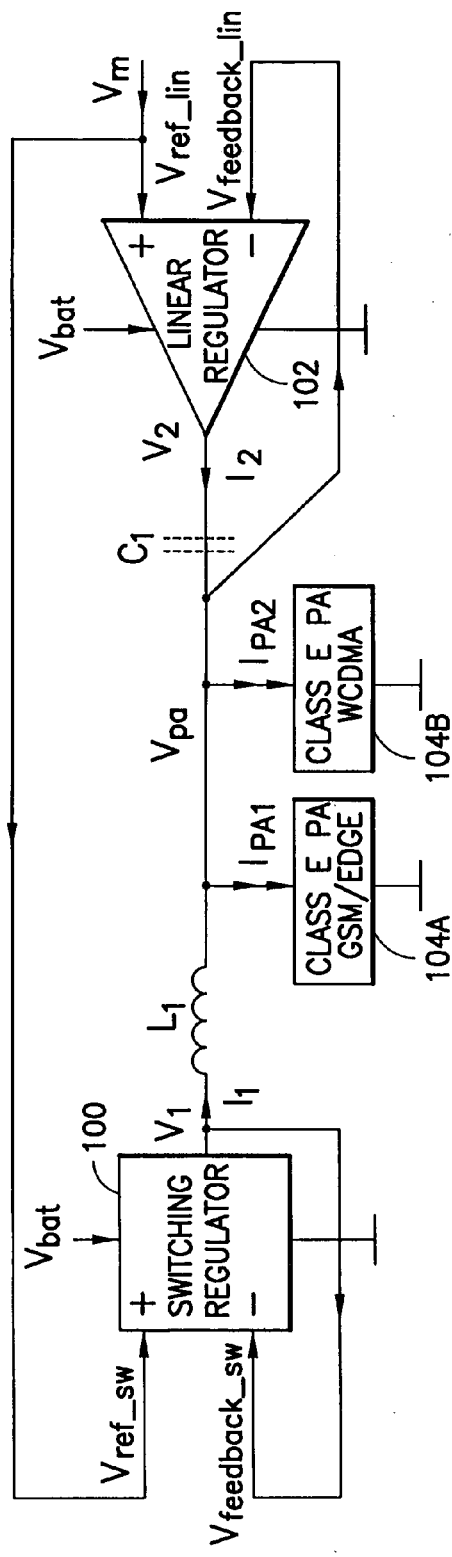
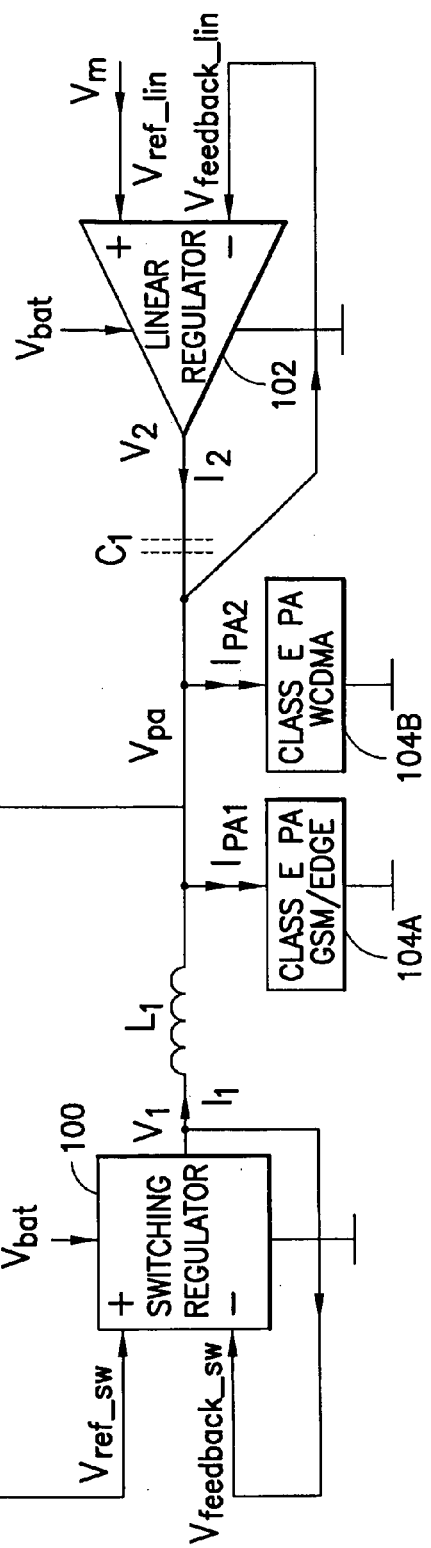
FIG. 26A
FIG. 26B

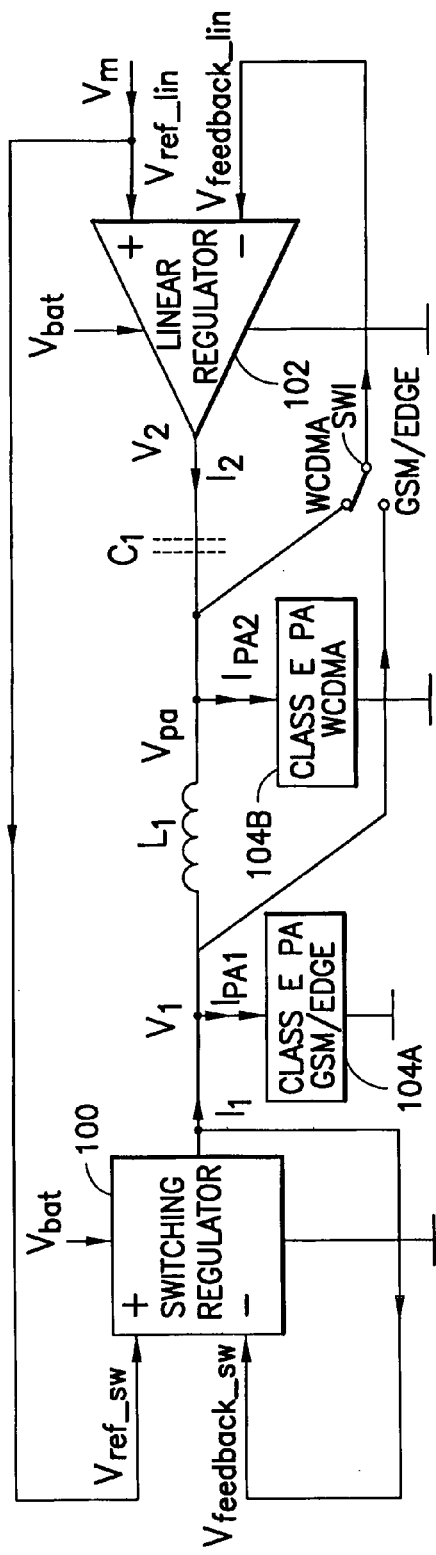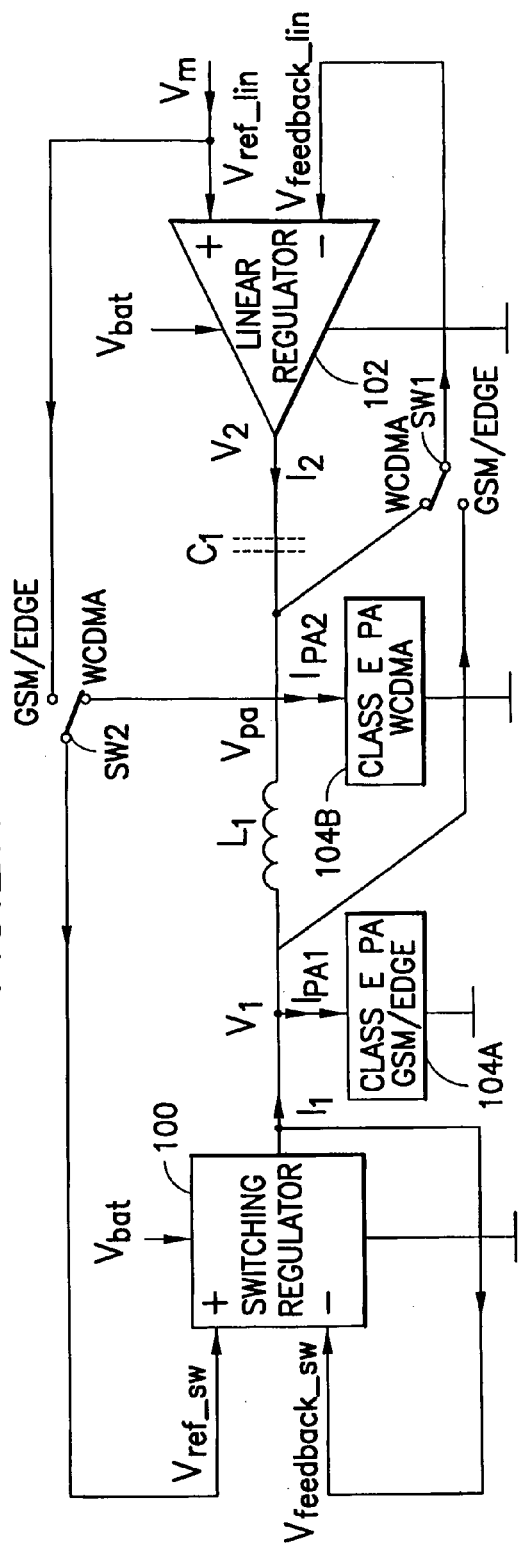
FIG.27A
FIG.27B

HYBRID SWITCHED MODE/LINEAR POWER AMPLIFIER POWER SUPPLY FOR USE IN POLAR TRANSMITTER

CROSS-REFERENCE TO RELATED APPLICATIONS

This patent application is a divisional patent application of Non-Provisional patent application Ser. No. 10/943,547, filed Sep. 16, 2004, now U.S. Pat. No. 7,058,373 which claims priority under 35 U.S.C. §119(e) from Provisional Patent Application No. 60/503,303, filed Sep. 16, 2003, the disclosure of which is incorporated by reference herein in its entirety.

TECHNICAL FIELD

This invention relates generally to DC to DC converter power supplies, more specifically switched mode power supplies (SMPS) that are suitable for use in radio frequency (RF) transmitters, such as RF transmitters for cellular mobile stations that are embodied as envelope restoration (ER) RF transmitters, also known as polar transmitters, where a symbol is represented using phase and amplitude components, rather than complex In-phase/Quadrature Phase (I/Q) components.

BACKGROUND

FIG. 1A is a simplified block diagram showing an ER transmitter (TX) 1 architecture that includes an amplitude modulation (AM) chain and a phase modulation (PM) chain. Bits to be transmitted are input to a bits to polar converter 2 that outputs an amplitude signal, via propagation delay (PD) 3, to an amplitude modulator (AM) 4. The AM 4 (after digital to analog conversion) supplies a signal for controlling the output level of a TX power amplifier (PA) 6 through the use of a controllable power supply 5. The bits to polar converter 2 also outputs a phase signal via propagation delay 3 to a frequency modulator (FM) 7, which in turn outputs a signal via a phase locked loop (PLL) 8 to the input of the PA 6. The transmitted signal at an antenna 9 is thus generated by simultaneously using both phase and amplitude components. The benefits that can be gained by using the ER transmitter architecture include a smaller size and an improved efficiency.

As can be appreciated, the supply voltage of the PA 6 should be amplitude modulated with high efficiency and with a wide bandwidth.

Discussing the power supply 5 and PA 6 now in further detail, high efficiency TX architectures, such as the polar loop modulation TX, typically rely on highly-efficient but non-linear power amplifiers, such as switch mode power amplifiers (SMPA), for example a Class E SMPA, or they rely on normally linear power amplifiers that are driven into saturation, such as the saturated Class B power amplifier. In these architectures the amplitude information is provided by modulating the supply voltage of the PA 6 by means of a power regulator that is connected between a DC supply or power source, typically a battery, and the PA 6, as shown in greater detail in FIG. 1B.

In FIG. 1B the output of the power supply 5, $V_{pa}$, should be capable of tracking a rapidly varying reference voltage $V_m$. As such, the power supply 5 must meet certain bandwidth specifications. The required bandwidth depends on the system in which the transmitter 1 is used. For example, the required bandwidth exceeds 1 MHz (dynamic range ~17 dB for a given power level) for the EDGE system (8PSK modulation), and exceeds 15 MHz (dynamic range ~47 dB for a given power level) for the WCDMA (wideband code division multiple access) system. As may be appreciated, these are very challenging requirements. A typical waveform (RF envelope in the EDGE system) that must be tracked is shown in FIG. 2, where the modulating voltage ($V_m$) is shown as varying between minimum and peak values (the typical rms and average values are also shown).

It is noted that in the GSM system the modulation is GMSK, which has a constant RF envelope, and thus for a given power level imposes no particular constraints in terms of bandwidth on the power supply 5.

In general, there are two primary techniques to implement the power supply 5. A first technique, shown in FIG. 3, uses a linear regulator implemented with a summing junction 10, a driver 12 and a power device 14. While a high bandwidth can be obtained, the efficiency is low due to the voltage drop ($V_{drop}$) across the power device 14.

A second technique, shown in FIG. 4, would be to use a switch mode regulator. In this technique, which is not admitted has been previously used in a polar or ER transmitter, a step-down switching regulator 16 would include a Buck-type or similar converter 18 and voltage-mode control circuitry 20. The PA 6 is shown represented by its equivalent resistance $R_{pa}$. While the efficiency of the switch mode regulator 16 can be very high, the required bandwidth would be difficult or impossible to obtain. More specifically, if one where to attempt the use of the switching regulator 16 it would require a very high switching frequency (e.g., at least approximately five times the required bandwidth, or 5-10 MHz or more for EDGE and over 80 MHz for WCDMA). While a switching frequency of 5-10 MHz would be very technically challenging (typical commercial DC-DC converters operate with maximum switching frequencies in the range of about 1-2 MHz), a DC-DC converter having a 100 MHz switching frequency, for example, is currently impractical to implement, especially in low cost, mass produced devices such as cellular telephones and personal communications terminals.

In U.S. Pat. No. 6,377,784 B2, "High-Efficiency Modulation RF Amplifier", by Earl McCune (Tropian, Inc.), there is purportedly described high-efficiency power control of a high-efficiency (e.g., hard-limiting or switch-mode) power amplifier in such a manner as to achieve a desired modulation. In one embodiment, the spread between a maximum frequency of the desired modulation and the operating frequency of a switch-mode DC-DC converter is purportedly reduced by following the switch-mode converter with an active linear regulator. The linear regulator is said to be designed so as to control the operating voltage of the power amplifier with sufficient bandwidth to faithfully reproduce the desired amplitude modulation waveform. The linear regulator is said to be further designed to reject variations on its input voltage even while the output voltage is changed in response to an applied control signal. The rejection is said to occur even though the variations on the input voltage are of commensurate, or even lower, frequency than that of the controlled output variation. Amplitude modulation is said may be achieved by directly or effectively varying the operating voltage on the power amplifier while simultaneously achieving high efficiency in the conversion of primary DC power to the amplitude modulated output signal. High efficiency is purportedly enhanced by allowing the switch-mode DC-to-DC converter to also vary its output voltage such that the voltage drop across the linear regulator is kept at a low and relatively constant level. It is said that time-division multiple access (TDMA) bursting capability may be combined with efficient amplitude modulation, with control of these functions being combined, and that the variation of average output power level in accordance with commands from a communications system may also be combined within the same structure.

SUMMARY OF THE PREFERRED EMBODIMENTS

The foregoing and other problems are overcome, and other advantages are realized, in accordance with the presently preferred embodiments of these teachings.

In one aspect this invention provides a DC-DC converter that has a switch mode part for coupling between a DC source and a load, the switch mode part providing x amount of output power; and that further has a linear mode part coupled in parallel with the switch mode part between the DC source and the load, the linear mode part providing y amount of output power. In the preferred embodiment x is preferably greater than y, and the ratio of x to y may be optimized for particular application constraints. Further, the linear mode part exhibits a faster response time to a required change in output voltage than the switch mode part. In one embodiment the linear mode part includes at least one power operational amplifier operating as a variable voltage source, while in another embodiment the linear mode part includes at least one power operational transconductance amplifier operating as a variable current source.

In a further aspect this invention provides a RF transmitter (TX) for coupling to an antenna. The TX has a polar architecture and includes an amplitude modulation (AM) path coupled to a power supply of a power amplifier (PA), and a phase modulation (PM) path coupled to an input of the PA. The power supply is constructed so as to have a switch mode part for coupling between a battery and the PA, the switch mode part providing x amount of output power, and to further have a linear mode part coupled in parallel with the switch mode part between the battery and the PA. The linear mode part provides y amount of output power, where x is preferably greater than y, and the ratio of x to y may be optimized for particular application constraints. Preferably the linear mode part exhibits a faster response time to a required change in output voltage than the switch mode part.

In a still further aspect this invention provides a method to operate a RF TX having the polar architecture comprised of the AM path that is coupled to the power supply of the PA and the PM path that is coupled to the input of the PA, the method including providing the power supply so as to comprise a switch mode part for coupling between a power source and the PA, the switch mode part providing x amount of output power; and coupling a linear mode part in parallel with the switch mode part between the power source and the PA, the linear mode part providing y amount of output power, where x is preferably greater than y, and the ratio of x to y may be optimized for particular application constraints, and where the linear mode part exhibits a faster response time to a required change in output voltage than the switch mode part.

In operation, the power supply provides higher power conversion efficiency than a purely linear voltage regulator-based power supply while also providing a wider operational bandwidth than a purely switch mode-based power supply.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIGS. 6A-6F illustrate simplified schematic diagrams of embodiments of the hybrid voltage regulator shown in FIG. 5;

FIG. 7A illustrates the general circuit concept and where FIG. 7B shows the switching part in more detail;

FIG. 10A illustrates the general circuit concept and where FIG. 10B shows the switching part in more detail;

FIG. 13A illustrates the general circuit concept and where FIG. 13B shows the switching part in more detail;

FIG. 16A illustrates the general circuit concept and where FIG. 16B shows the switching part in more detail;

FIGS. 25A and 25B, collectively referred to as FIG. 25, show a control block diagram in accordance with the embodiment shown in FIG. 24, where in FIG. 25A both the switching regulator and the linear regulator are masters, and in FIG. 25B the linear regulator is the master and the switching regulator is the slave;

FIGS. 26A and 26B, collectively referred to as FIG. 26, show a first multi-mode (multi-PA) control block diagram in accordance with the embodiment shown in FIG. 24, where all PAs are connected on the same supply line at the output of the linear regulator, and where in FIG. 26A both the switching regulator and the linear regulator are masters, and in FIG. 26B the linear regulator is the master and the switching regulator is the slave;

FIGS. 27A and 27B, collectively referred to as FIG. 27, show a second multi-mode control block diagram in accordance with the embodiment shown in FIG. 24, where a GSM/EDGE PA is connected at the output of the switching regulator and a WCDMA PA is connected at the output of the linear regulator, where in FIG. 27A both the switching regulator and the linear regulator are masters, and in FIG. 27B the linear regulator is the master and the switching regulator is the slave (in the WCDMA mode only);

DETAILED DESCRIPTION OF THE PREFERRED EMBODIMENTS

Figure 5:
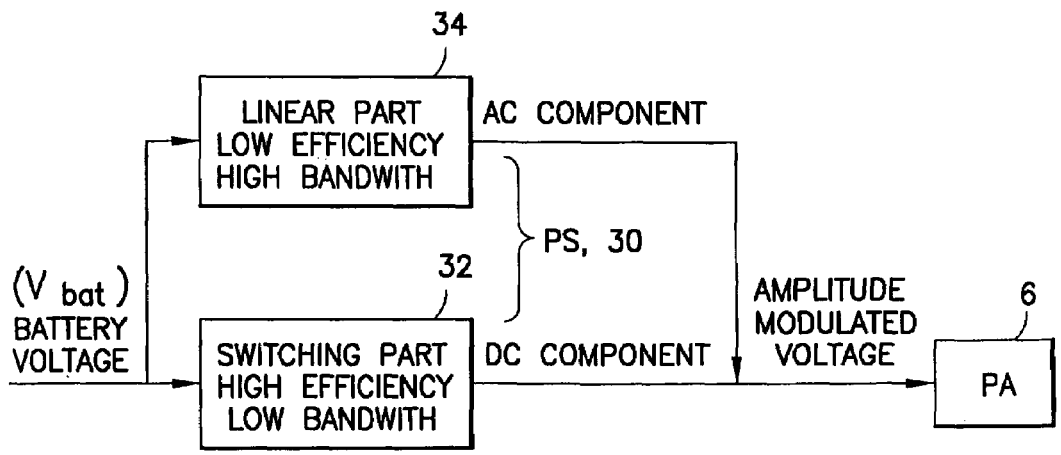
FIG. 5 is a block diagram of the PA supplied by a hybrid voltage regulator in accordance with this invention, where a linear part of the hybrid voltage regulator preferably processes only a small part of the required output power, and provides the necessary bandwidth, while a switch mode part preferably supplies the majority of the output power with high efficiency.

Referring to FIG. 5, this invention provides a hybrid voltage regulator or power supply 30 that combines a switching part 32, that processes preferably the majority of the power with high efficiency but low bandwidth, with a linear part 34, that preferably processes a smaller part of the required power with less efficiency but with high bandwidth. The result is a power supply that has the required bandwidth and an efficiency somewhat lower than that of a purely switching power supply, but still significantly higher than that of the purely linear regulator. The resulting hybrid power supply 30 provides an improved output voltage quality, as the linear part 34 can be used to compensate the output voltage ripple that is normally associated with a purely switching mode power supply. This is a significant benefit, as an excessive amount of output voltage ripple can adversely affect the output spectrum of the PA 6.

It is noted that in principle the amount of power (x) that is processed by the switching part 32 is greater than the amount of power (y) processed by the linear part 34. This is generally a desirable situation and, in fact, in many embodiments x is much greater than y. However, this relationship between the power processed by the switching part 32 and the linear part 34 is not to be construed as a limitation of the preferred embodiments of this invention. In principle, one desires to maximize the ratio of x to the total power: the larger is this ratio, the higher is the efficiency. However, the actual ratio that is realized in a given application can be a function of one or more of the following factors and considerations:

(a) the intended application (RF system specifics, such as the spectrum of RF envelope, amplitude of high frequency AC components, etc); and (b) the implementation, where one may decide to some extent how much power to process with the switching part 32 and how much with the linear part 34. For example, in EDGE one can process almost all of the power with the switching part 32 by using a 6-7 MHz switching frequency, or less power by using a slower switching converter operating at, e.g., 1 MHz. One may also in certain situations, e.g., at very low power, disable the switching part 32 and use only the linear part 34, in which case the relationship x>y does not apply at all.

(c) Also to be considered may be trade-offs in efficiency vs. implementation complexity, as it is generally simpler to realize a slow switching converter, but then the efficiency is reduced because a larger portion of the power needs to be processed by linear part 34.

(d) Also to be considered may be trade-offs intended to optimize the overall efficiency. For example, a switching part 32 with very high switching frequency and high bandwidth may process most of the power in a given application (x much larger than y), but the processing in the switching part 32 may be with low efficiency due to the very high switching frequency. Therefore it may be more advantageous to attempt to optimize the overall efficiency through a trade-off between using a lower switching frequency for better efficiency in the switching part 32, versus a lower amount of energy processed in the switching part 32.

Thus, in general the portion of the power x processed by the switching part 32 is preferably greater than the portion of the power y processed by the linear part 34, and also the ratio of x to y is preferably optimized for the constraints imposed by a given application, and possibly also by a particular mode of operation (e.g., in the low power mode mentioned above, where all power may be processed by the linear part 34). A combination may also be considered, such that x is preferably greater than y, and the ratio of x to y also may be optimized for the application constraints.

Figure 4A:
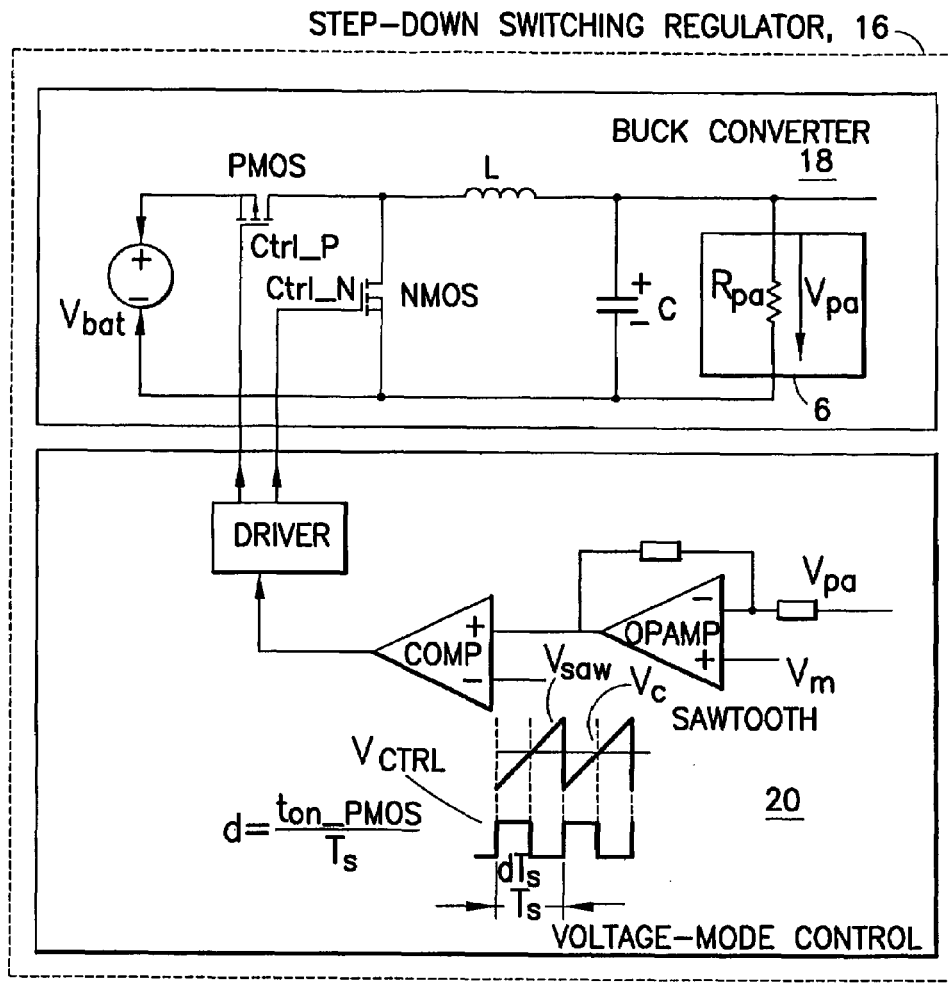
FIGS. 4A and 4B show examples of a switching regulator supplying the PA.

In practice, the invention may be implemented by taking a portion of the topology of a switching converter (referred to in FIG. 5 as the "switching part") and paralleling it with a voltage or a current source (referred to in FIG. 5 as the "linear part"). The output capacitor (C) of the Buck (step-down) converter 18 of FIG. 4A is removed. In the Buck converter 18 the capacitor acts as a voltage source to maintain the output voltage constant. When the voltage at the output is required to be increased, a large current must be provided via the inductor (L) to meet the increased demand of the load and to charge the capacitor (C) to the new, higher voltage level. This operation makes the switching regulator 16 slow, and limits the bandwidth. However, if the capacitor (C) is replaced by a voltage source, the increased (or decreased) voltage level can provide very quickly via the paralleled voltage source of the linear part 34, while the slower switching part readjusts its operating point.

Referring again also to FIG. 2, the switching part 32 provides the average level $V_{m\_av}$, while the linear part 34 provides the AC component superimposed on the average level.

An alternative embodiment, based on the same concept, uses a current source in place of the voltage source in the linear part 34.

The voltage source of the linear part 34 may be implemented using a power operational amplifier (POA), while the current source of the linear part 34 may be implemented using a power operational transconductance amplifier (OTA). The operational amplifier of the linear part 34 can be supplied by the battery voltage ($V_{bat}$) as shown in FIG. 5. In an alternative, presently more preferred embodiment (from an efficiency point of view) the operational amplifier of the linear part 34 is supplied with the voltage $V_{m\_pk}$ from FIG. 2, i.e., with a voltage that corresponds to the amplitude of the reference signal, where $V_{m\_pk}$ is always lower than $V_{bat}$. In practice, it is preferred to supply the operational amplifier of the linear part 34 with the voltage $V_{m\_pk}$ plus some margin (0.2V for example) that is need to obtain correct operation of the linear stage.

Figure 6A:
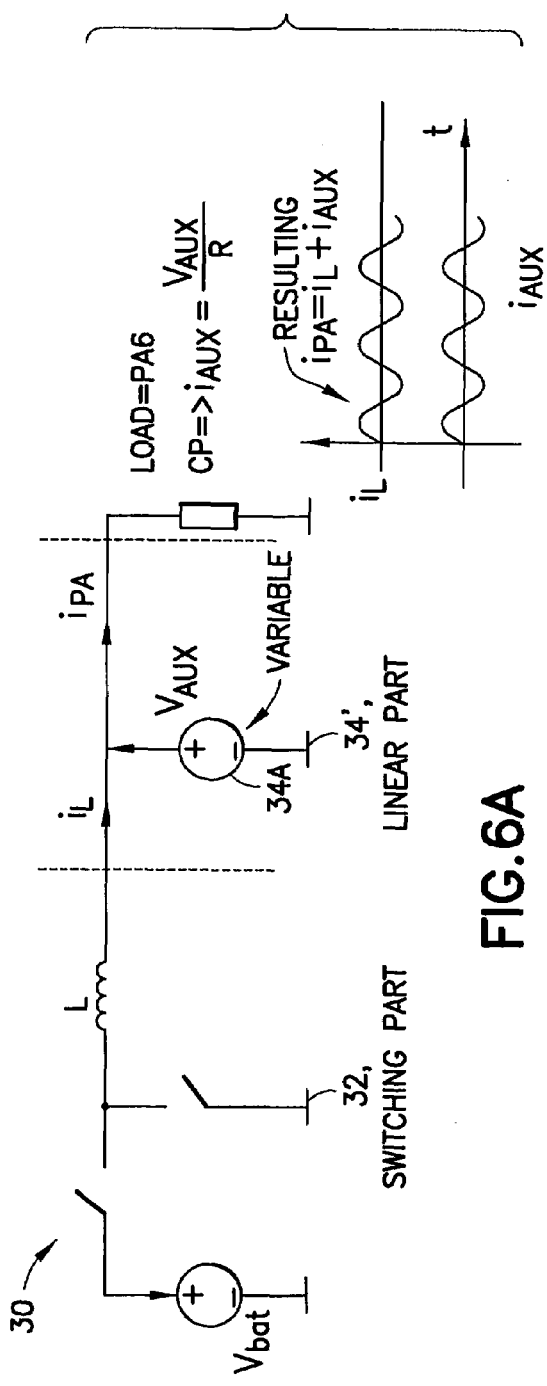
Figure 6B:
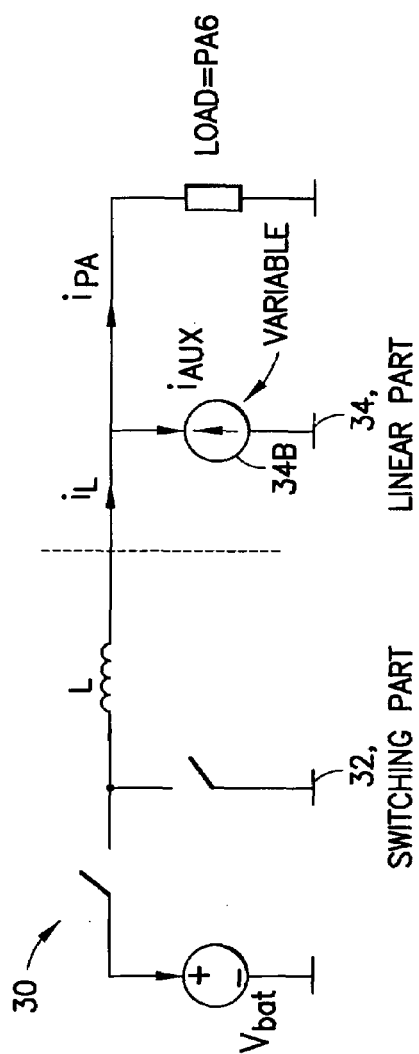
Figure 6E:
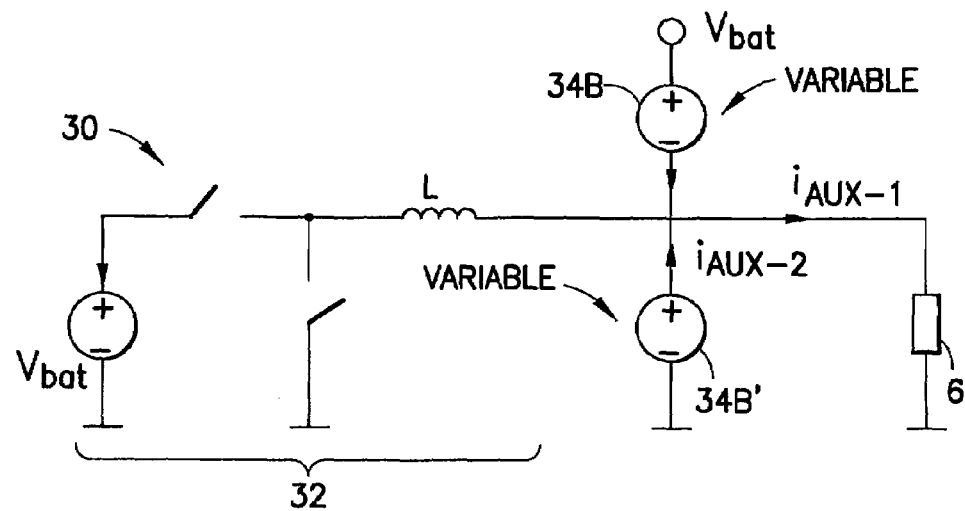
Figure 6F:
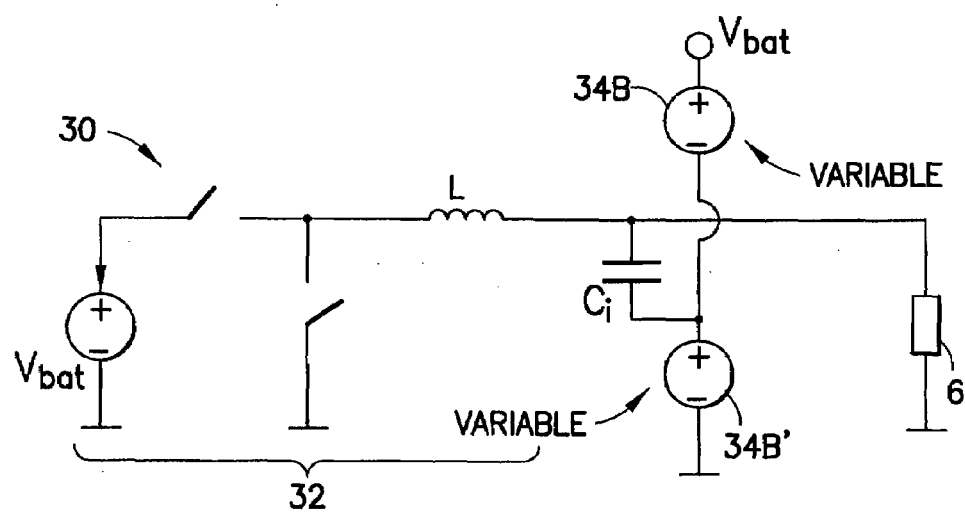

FIGS. 6A-6F illustrate various embodiments of the hybrid voltage regulator 30 shown in FIG. 5, where FIGS. 6A, 6C and 6D show the use of a variable voltage source 34A (e.g., the power operational amplifier mentioned above), and where FIGS. 6B, 6E and 6F show the use of a variable current source 34B (e.g., the power operational transconductance amplifier mentioned above). Note that in FIG. 6C two variable voltage sources 34A and 34A' are used, and that in FIG. 6D the two variable voltage sources 34A and 34A' are capacitively coupled via C1 to the output power rail of the switching part 32. Note as well that in FIG. 6E two variable current sources 34B and 34B' are used, and that in FIG. 6F the two variable current sources 34B and 34B' are capacitively coupled via C1 to the output power rail of the switching part 32.

Figure 3A:
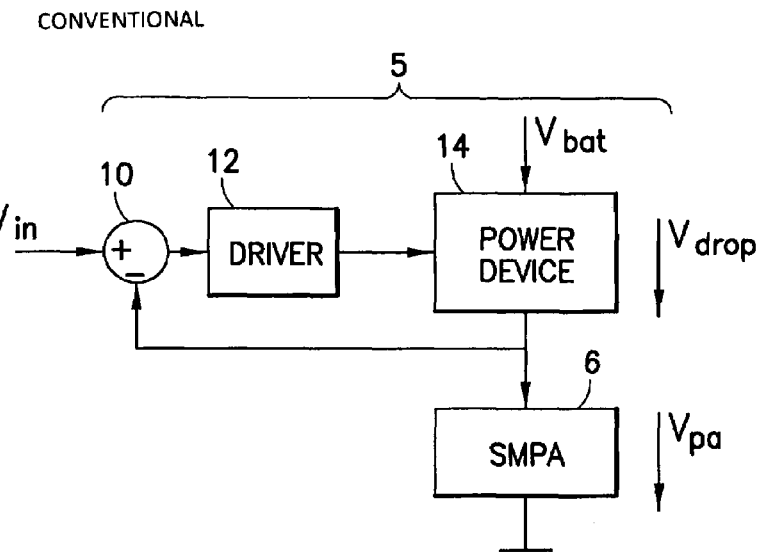
FIGS. 3A and 3B show conventional examples of a linear voltage regulator supplying the PA.
Figure 3B:
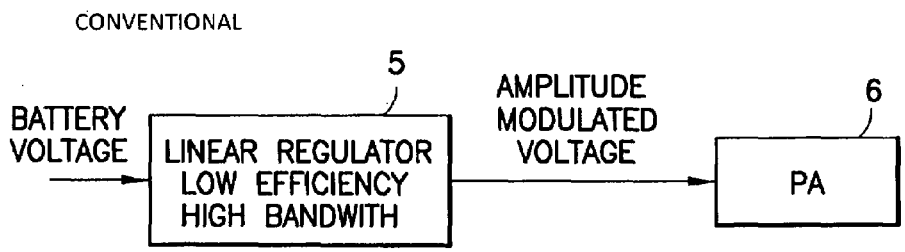

Based on the foregoing description it can be appreciated that the use of this invention allows the realization of an efficient PA power supply 30 for TX architectures where the PA supply voltage is required to be amplitude modulated. Currently, this is possible only by using the inefficient linear regulator (see FIGS. 3A and 3B), as there is no switching regulator commercially available, that is known to the inventor, that would provide the required bandwidth.

The foregoing and other embodiments of this invention are now described in even further detail.

Figure 7A:
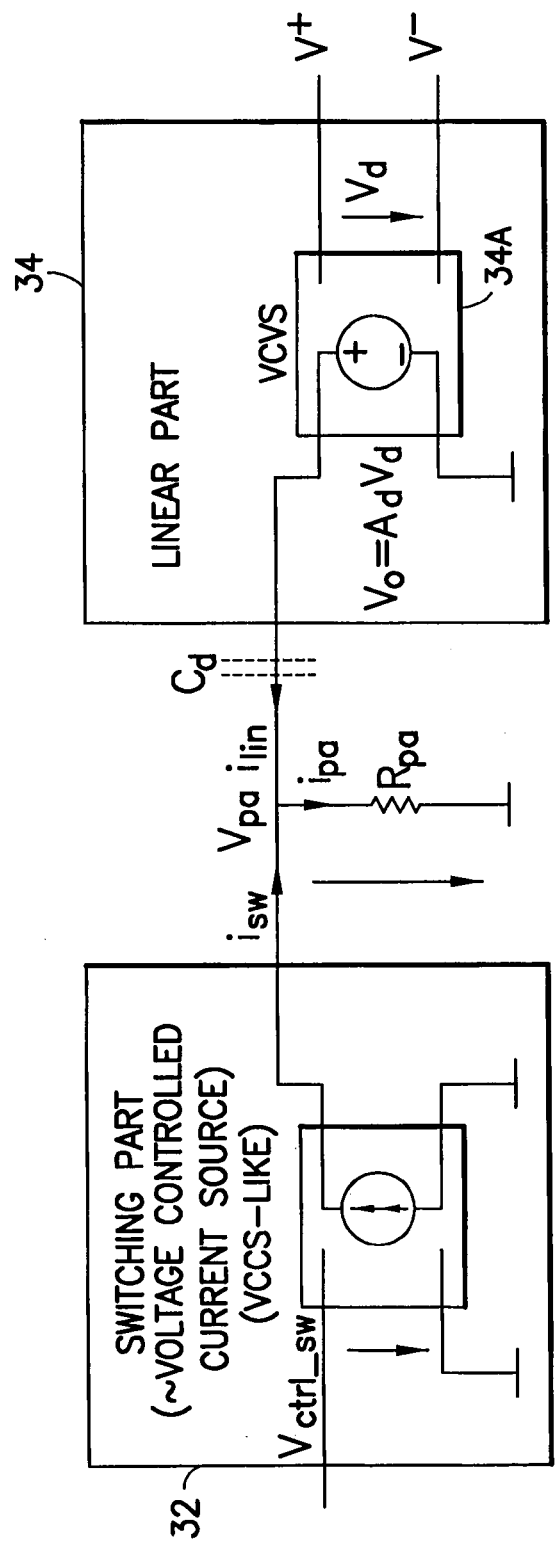
FIGS. 7A and 7B, collectively referred to as FIG. 7, relate to the circuit shown in FIG. 6A, where
Figure 7B:
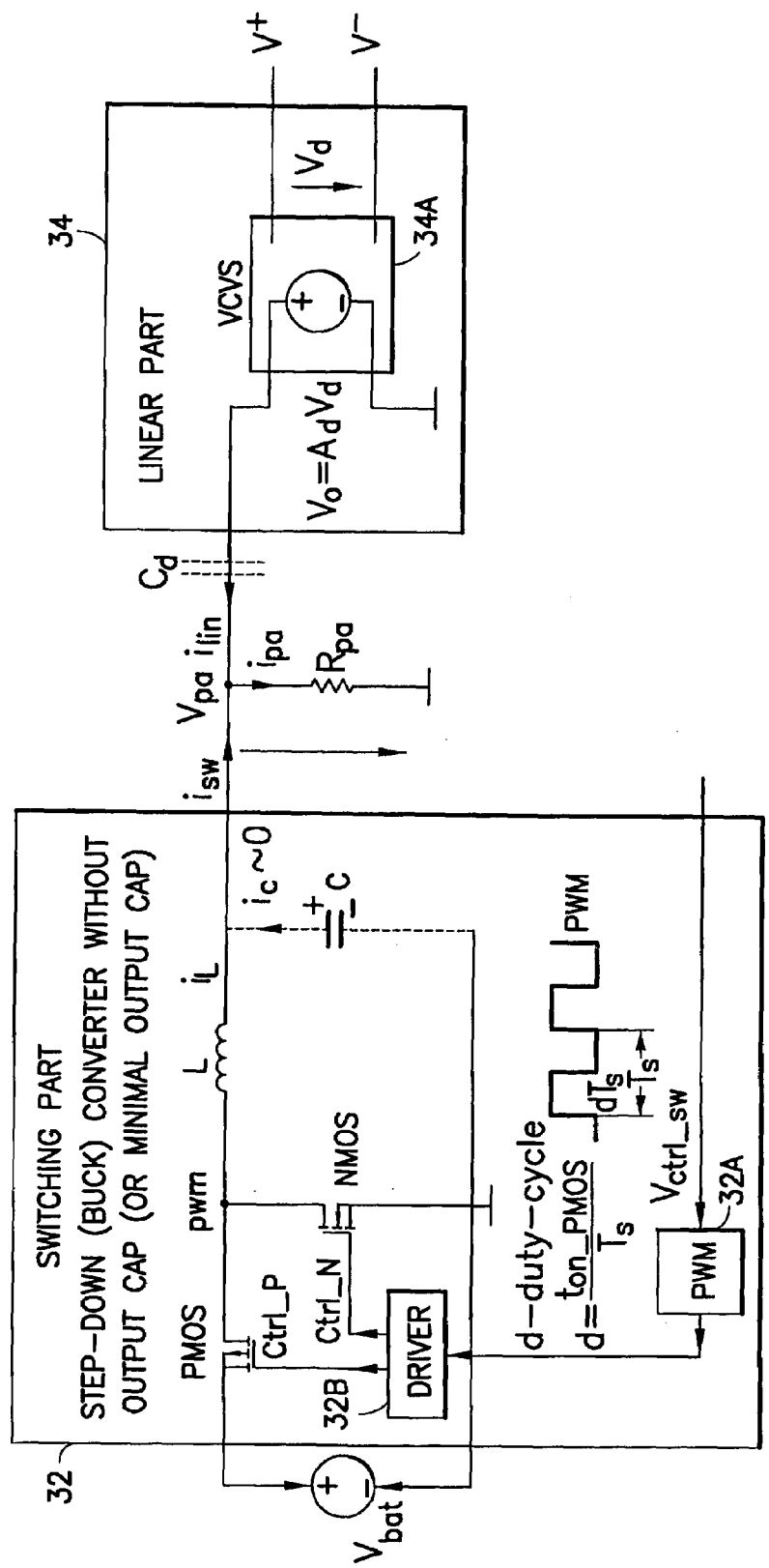

The circuit shown in FIG. 7 relates to the circuits shown in FIG. 6A, where FIG. 7A illustrates the general circuit concept and where FIG. 7B shows the switching part 32 in more detail. The switching part 32 is obtained from a Buck converter, which is a step-down switching DC-DC converter composed of two switching devices and an L-C filter. The switching devices, represented in FIG. 7B as complementary MOS transistors (PMOS/NMOS), conduct alternatively with duty-cycle d (d=the ratio of time $t_{on\_PMOS}$, when the upper switch is conducting, to the switching period $T_s$). The control signal with duty-cycle d can be obtained from an analog Pulse Width Modulator (PWM) block 32A, which converts a control voltage $V_{ctrl\_sw}$ to a PWM signal with duty cycle d by comparing $V_{ctrl\_sw}$ with a sawtooth signal having period $T_s$. The PWM signal, fed to transistor driver stage 32B, can also be generated with other methods, such as in a digital PWM block.

The conventional Buck converter typically includes an L-C output filter, where C is large enough so that the characteristic of the Buck converter is that of a voltage source. However, in the presently preferred embodiments of this invention the filtering capacitor is removed, or is retained but with minimal capacitance. As such, block 32 is referred to herein as a "switching part", as opposed to a "switching converter". In practice, a physical circuit will have some filtering capacitance, for example, an amount needed to ensure the stability of the RF PA 6. However, it is assumed for the purposes of this invention that the capacitance value (C) is significantly less than that found in a conventional Buck converter, so that the characteristic of the switching part 32 is predominantly that of a current source, and not a voltage source.

More specifically, the switching part 32 has the characteristic of a current source due to the inductor (L) (and no/minimal capacitance C), but is not an actual Voltage Controlled Current Source (VCCS). An increase in the control voltage $V_{ctrl\_sw}$ determines an increase in the duty-cycle d, which determines an increase in average output voltage $V_{pa}$, which in turn determines an increase in PA 6 current $I_{pa}$, and hence an increase in the DC component of the inductor current $I_L$. However, the absolute value of the PA 6 current $I_{pa}$ is determined not solely by the control voltage $V_{ctrl\_sw}$ but also by $R_{pa}$, as $I_{pa}=V_{pa}/R_{pa}$. Thus, while this technique may resemble operation of a "VCCS", it does not directly control the current and is therefore referred to as being "VCCS-like".

The linear part 34 functions as a Voltage Controlled Voltage Source (VCVS) 34A, and its output voltage $V_o$ is controlled by the differential voltage $V_d$, with differential amplification $A_d$.

More specifically, FIG. 7A illustrates this embodiment of the invention by assuming ideal sources: where the switching part 32 behaves like a current source and is connected in parallel with the linear part 34 that behaves like a bi-directional (i.e., it can both source and sink current) Voltage Controlled Voltage Source 34A. The linear part 34, being a voltage source, sets the PA 6 voltage $V_{pa}$. The current $i_{sw}$ from the switching part 32 adds with the current $i_{lin}$ from the linear part 34 to form the PA 6 current $i_{pa}$ ($R_{pa}$ represents the effective resistive impedance of the PA 6). The optional DC-blocking decoupling capacitor $C_d$ may be connected to ensure that the linear part 34 contributes only the AC component.

FIG. 7B shows that the switching part 32 is implemented with the step-down Buck converter from which the output filtering capacitance C has been eliminated or reduced significantly. The current $i_{sw}$ from the switching part 32 is thus in practice the inductor current $i_L$, resulting in essentially current-source-like behavior (the inductor L can be assimilated to a current source).

It is instructive to note that since the linear part 34 has the characteristics of a voltage source, it can fix the voltage level $V_{pa}$ applied on the PA, and that there is a means to control this voltage level. In addition, the linear part 34 is fast (wide bandwidth), hence it is possible to provide fast modulation of $V_{pa}$. Note further that the VCVS 34A of the linear part 34 is bi-directional, in the sense that can both source and sink current.

Figure 19A:
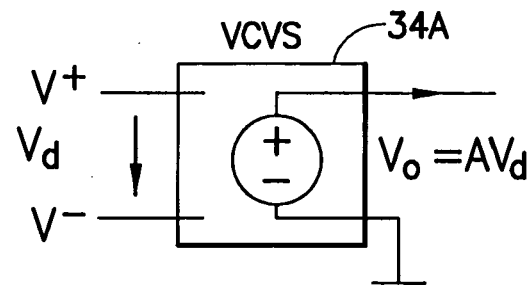
FIGS. 19A and 19B, collectively referred to as FIG. 19, show an equivalent circuit diagram of a Voltage Controlled Voltage Source (VCVS) and a VCVS circuit embodied as a Power Operational Amplifier (POA), respectively.
Figure 19B:
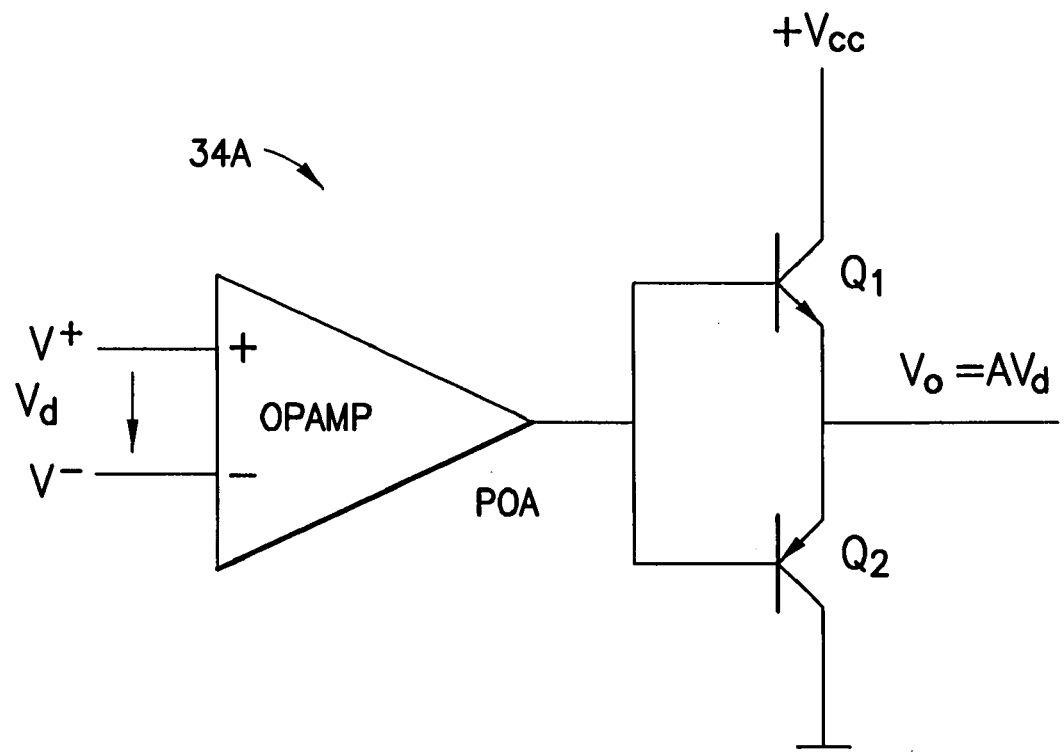

As shown in FIG. 19B, the VCVS 34A can be implemented as a Power Operational Amplifier (POA). The POA includes an operational amplifier (OPAMP) with a class A(B) stage that is able to sink/source the required current. FIG. 19B shows a Class B power stage comprised of transistors $Q_1$ and $Q_2$, but variations in the output stage design are possible to improve performance. For example, in practice the power stage could be implemented as a Class AB stage to reduce crossover distortion.

As was noted, the optional decoupling capacitor $C_d$ may be introduced to ensure that the linear part 34 provides only the AC current component. However, there are certain situations wherein it would be advantageous to allow the linear part 34 to also provide the DC component, albeit with more complicated control. As one example, it may be desirable to provide the DC component from the linear part 34 at low power levels where the switching part 32 may be de-activated and where the PA 6 current would be provided only by the linear part 34. As another example, it may be desirable to provide the DC component from the linear part 34 at low battery voltage levels, e.g. 2.9V, when the $V_{pa\_peak}$ is very close to this value, e.g. 2.7V, and the switching part 32 is not able to provide it. In such cases the optional $C_d$ would be removed.

Figure 8:
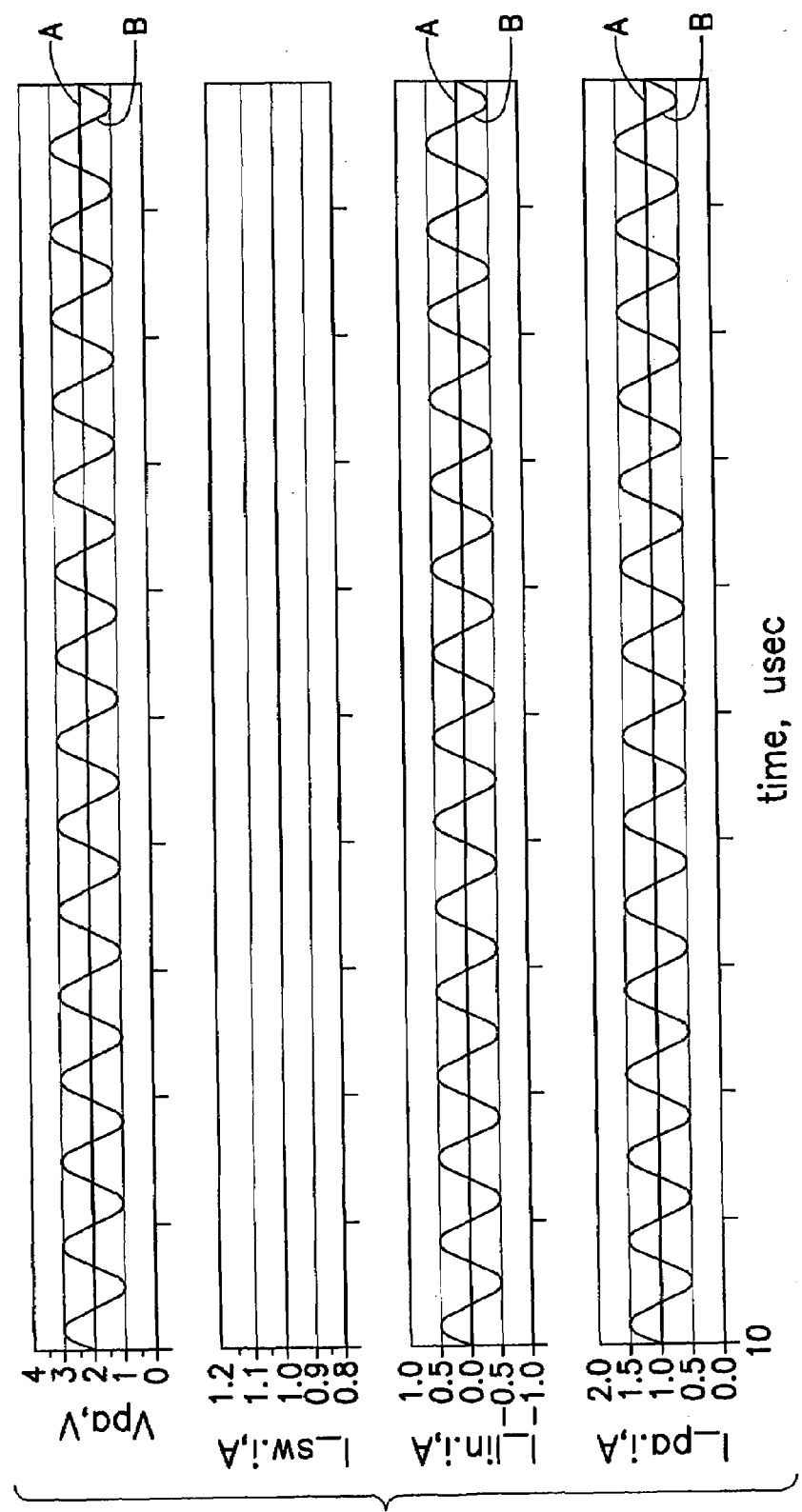
FIG. 8 shows waveforms that correspond to the operation of the circuit of FIG. 7.
Figure 9:
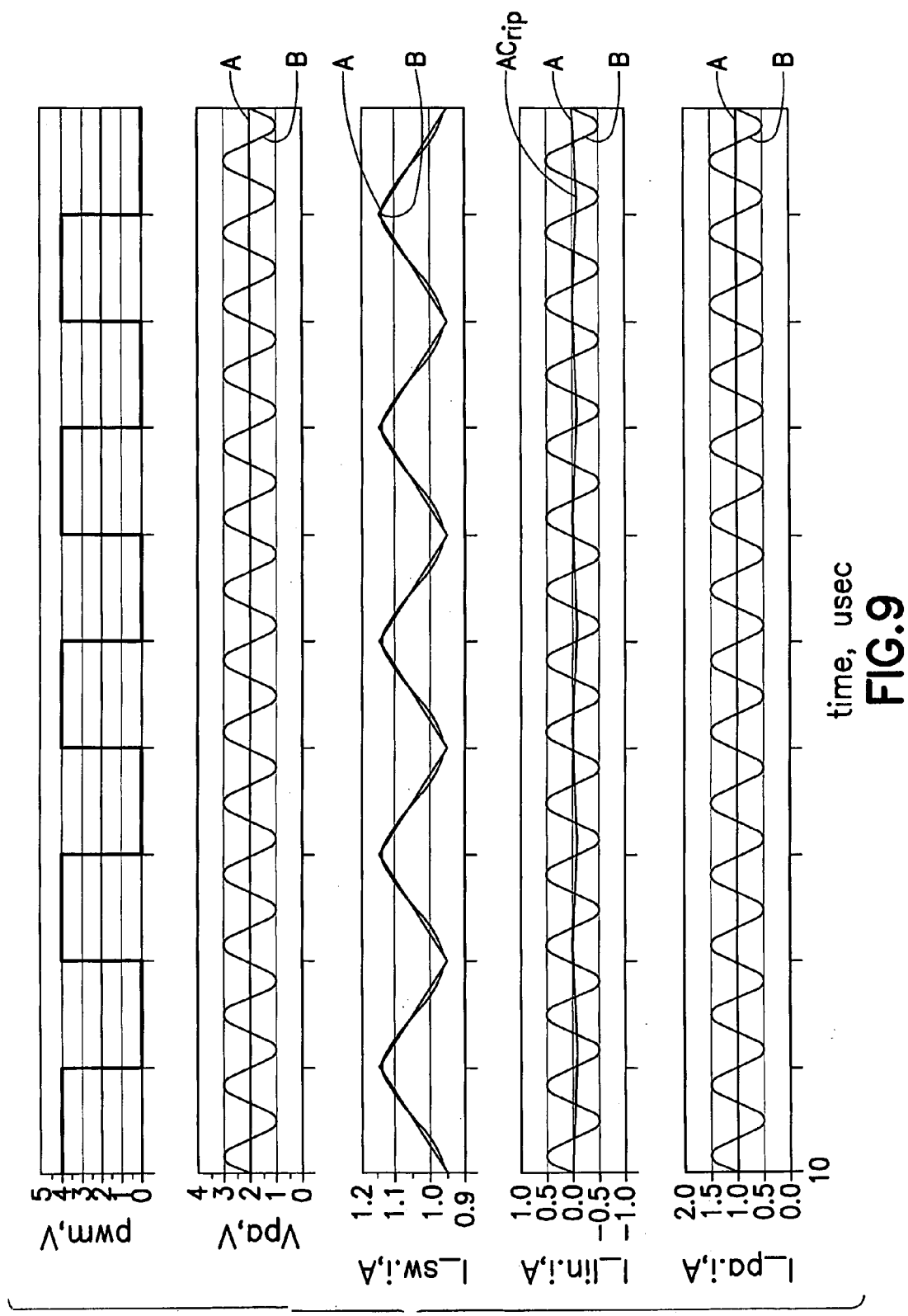
FIG. 9 also shows waveforms that correspond to the operation of the circuit of FIG. 7.

The operation of the circuit shown in FIG. 7A is illustrated with the simulated waveforms shown in FIG. 8, and the operation of circuit shown in FIG. 7B is illustrated with the simulated waveforms shown in FIG. 9.

The top waveform in FIG. 8 shows the resulting PA 6 voltage $V_{pa}$. The PA 6 voltage $V_{pa}$ is set by the linear stage 34 having the voltage source characteristic. In this example $V_{pa}$ has a DC component (2V) plus an AC component shown as a 15 MHz voltage sine wave representing fast modulation. The second waveform from the top shows the current contribution of the switching part 32, the constant current $i_{sw}$. The third waveform from top shows the current contribution of the linear part, the AC component $i_{lin}$ (a 15 MHz sine wave). As was noted, the linear part 34 functions as a bi-directional voltage source, i.e., it can both source and sink current. The bottom waveform shows that the resulting PA 6 current $i_{pa}$ has both a DC component from the switching part 32 and an AC component from the linear part 34.

Note that in FIG. 8 one set of waveforms is for a sine wave of amplitude zero (no contribution form the linear part 34, designated with "A"), and the other for a sine wave of non-zero amplitude (to show the contribution from the linear stage, designated with "B"). This same convention is used in the waveform diagrams of FIGS. 9, 11, 12, 14, 15, 17 and 18.

FIG. 9 depicts simulated waveforms to illustrate the operation of the circuit shown in FIG. 7B. It is assumed for this non-limiting example that the switching stage 32 has a switching frequency of 5 MHz and a duty cycle of 0.5. The top waveform shows the PWM 32A voltage applied on the inductor L at node pwm. Second waveform from the top shows the resulting PA 6 voltage $V_{pa}$. The PA 6 voltage $V_{pa}$ is set by the linear stage 34 having the voltage source characteristic. In this example $V_{pa}$ has a DC component (2V) plus an AC component of 15 MHz (voltage sine wave) representing the fast modulation. The third waveform from the top depicts the current contribution of the switching part 32, i.e., the inductor current $i_L = i_{sw}$. In this case the current is not constant, as in the ideal case depicted in FIG. 8, but has the specific triangular shape encountered in switching converters. The switching part 32 contributes a DC component and a triangular AC component (the inductor current ripple). The fourth waveform from top shows the current contribution of the linear part 34, the AC component $i_{lin}$ (15 MHz sine wave plus inductor current ripple compensation). Note that the linear part 34 contributes not only the 15 MHz sinusoidal component, but also an AC component to compensate for the inductor current ripple (as seen clearly from the underlying waveform designated $AC_{rip}$). This is due to the voltage source characteristic of the linear part 34 which, being a bi-directional voltage source, can both source and sink current. The bottom waveform shows that the resulting PA 6 current $i_{pa}$ has a DC component from the switching part 32 and an AC component from the linear part 34, where the AC triangular component of the inductor current (third trace) is compensated by the linear stage 34.

Figure 20A:
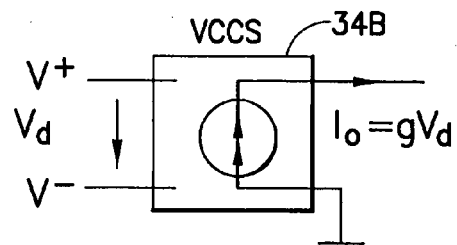
FIGS. 20A and 20B, collectively referred to as FIG. 20, show an equivalent circuit diagram of a Voltage Controlled Current Source (VCCS) and a VCCS circuit embodied as an Operational Transconductance Amplifier (OTA), respectively.
Figure 20B:
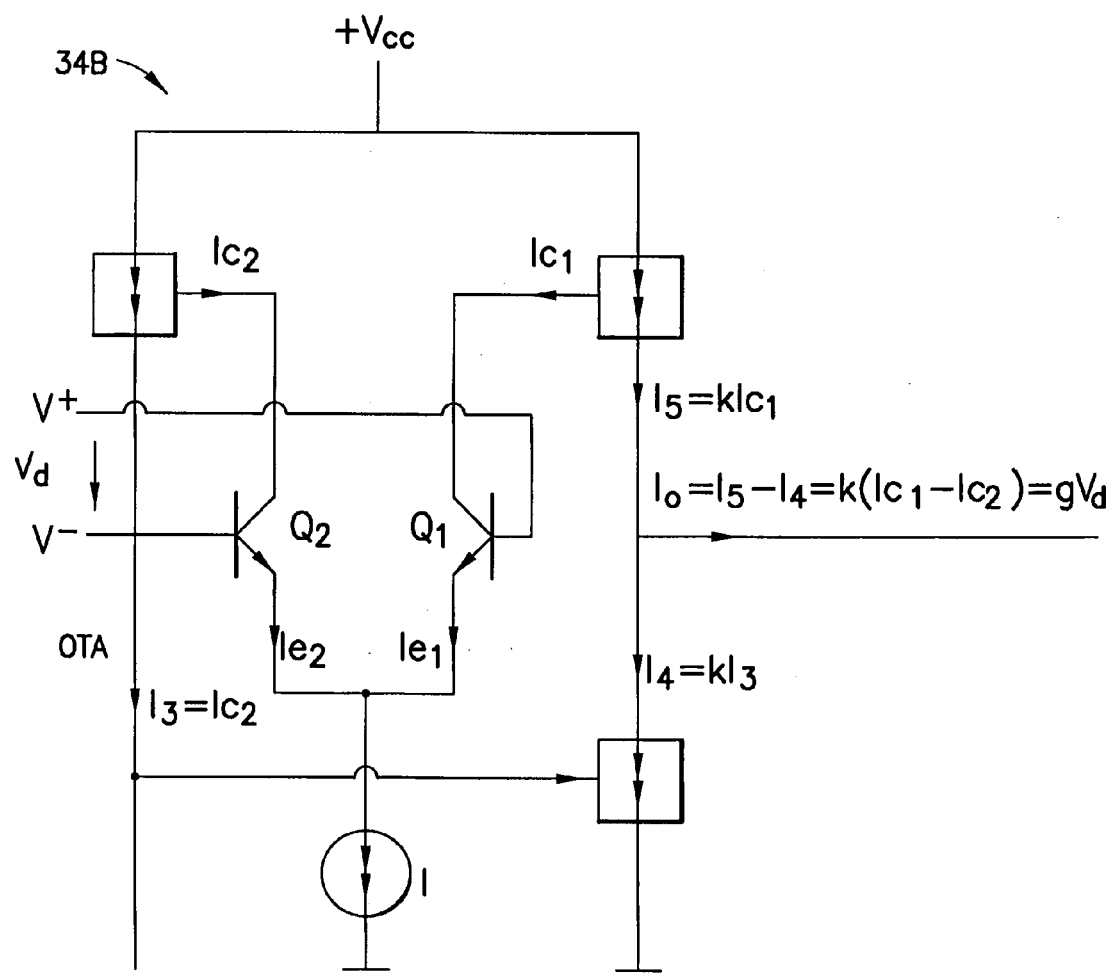

FIG. 10 shows an embodiment where a Voltage Controlled Current Source (VCCS) 34B is used to construct the linear part 34. In general, the same considerations apply as in the embodiment of FIG. 7, the only significant difference being that the VCCS is not capable itself to fix the PA 6 voltage level. Instead, the PA 6 voltage is determined by the total current injected into $R_{pa}$. The implementation of the linear part 34 can be as an Operational Transconductance Amplifier (OTA), as depicted in FIG. 20B. In this simplified view the collector current of $Q_1$ ($Ic_1$) in the differential pair is mirrored as $I_5$, while the collector current of $Q_2$ ($Ic_2$) is mirrored as $I_3$ and then $I_4$. The output current is $I_o = I_5 - I_4$, and is proportional to the difference between the collector currents $IC_1 - IC_2$, which in turn is proportional to the differential voltage $V_d$. As was noted, FIG. 20B shows a simplified representation of the OTA. In practice, a circuit implementation would aim to optimize the accuracy of the current mirrors and to obtain a linear characteristic $I_o = gV_d$.

Figure 10A:
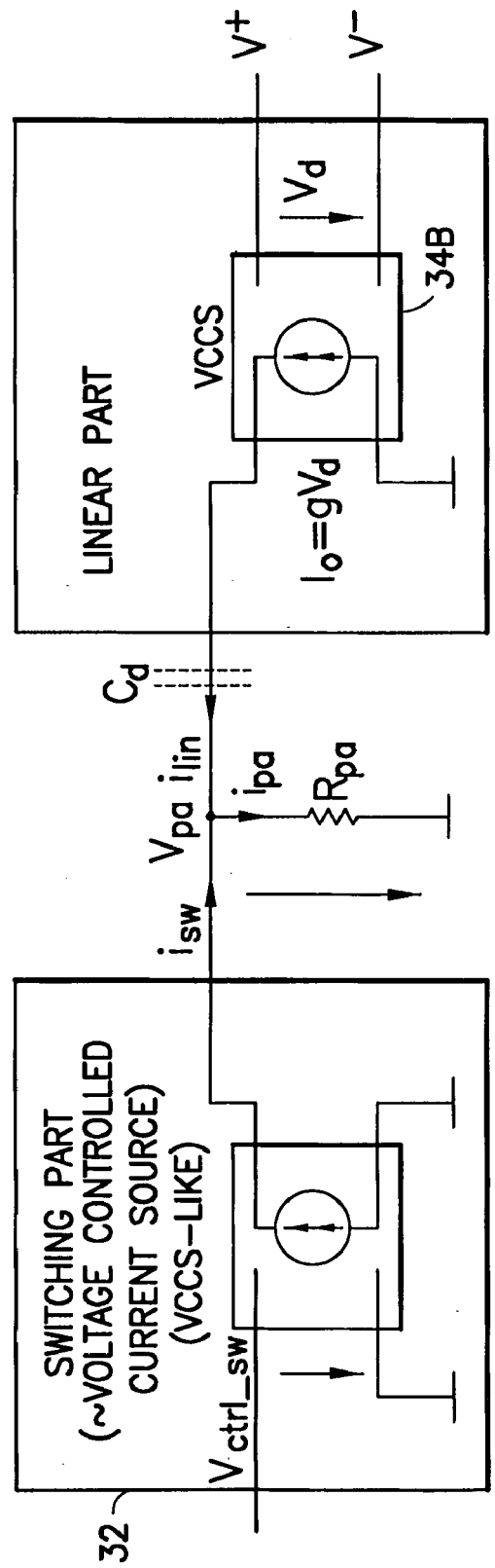
FIGS. 10A and 10B, collectively referred to as FIG. 10, relate to the circuit shown in FIG. 6B, where
Figure 10B:
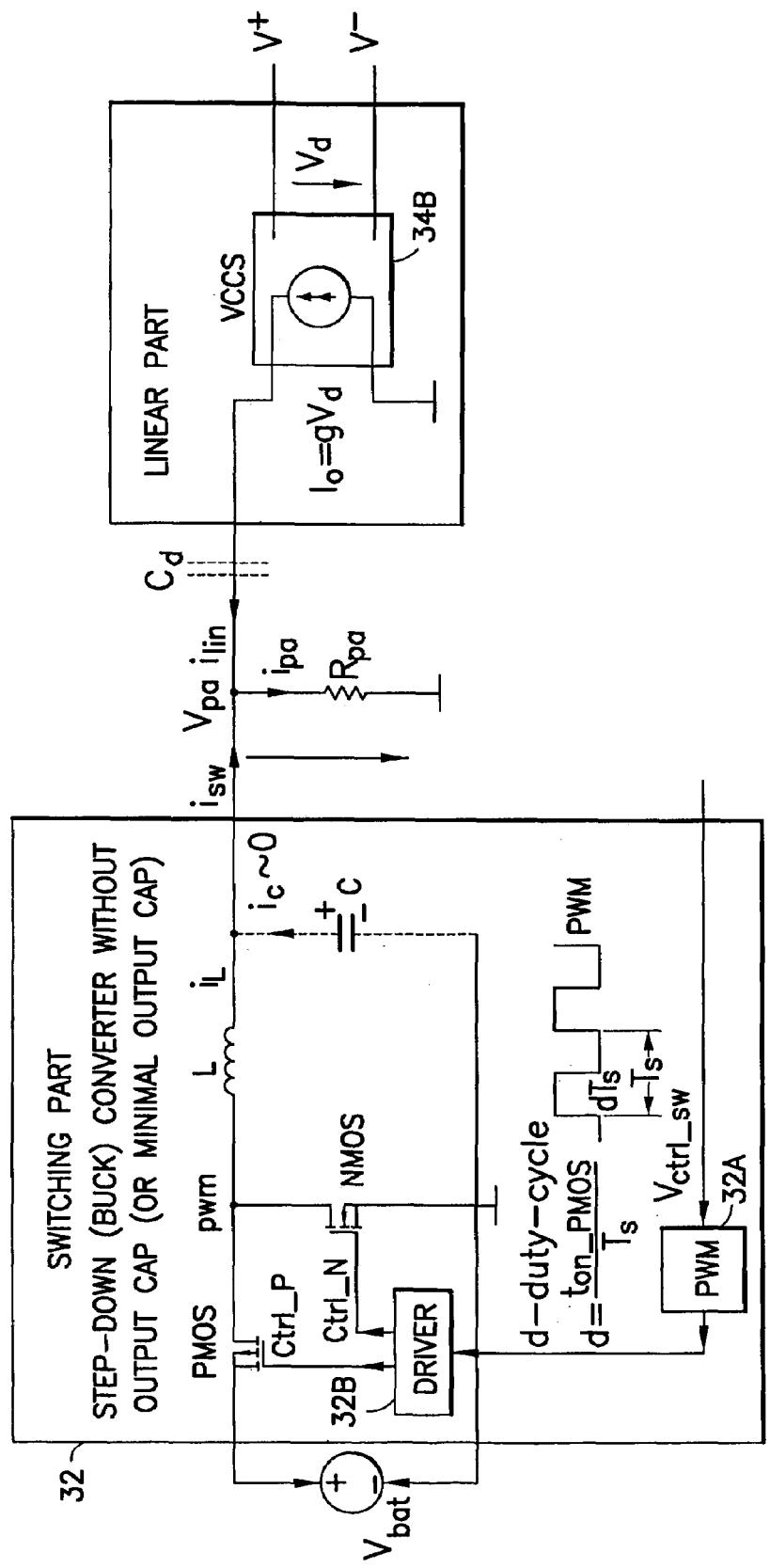
Figure 11:
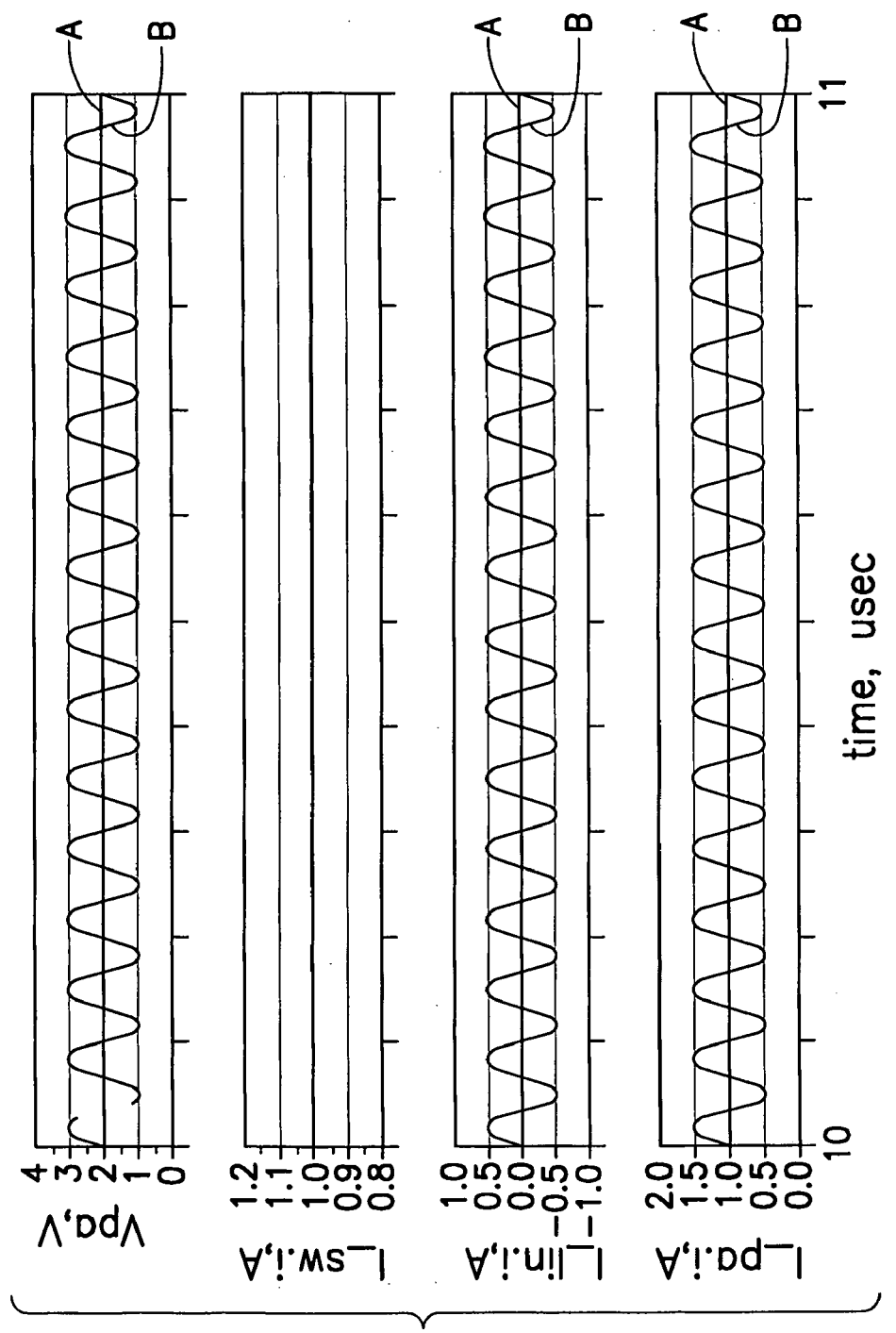
FIG. 11 shows waveforms that correspond to the operation of the circuit of FIG. 10.
Figure 12:
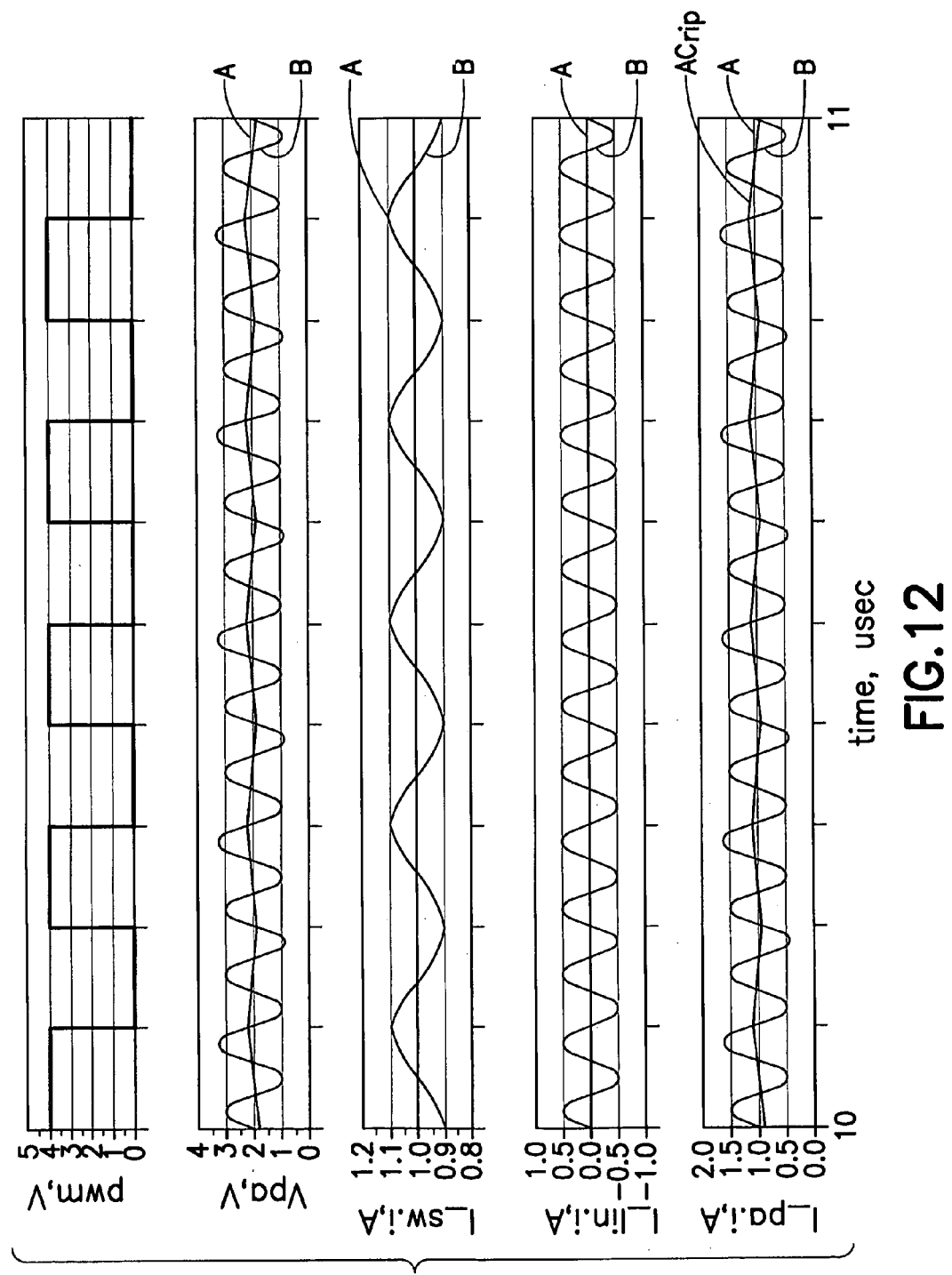
FIG. 12 also shows waveforms that correspond to the operation of the circuit of FIG. 10.

The operation of the circuit shown in FIG. 10A is illustrated with the simulated waveforms of FIG. 11, while the operation of the circuit shown in FIG. 10B is illustrated with the simulated waveforms of FIG. 12.

In FIG. 11 the top waveform shows the resulting PA 6 voltage $V_{pa}$. It is assumed that, from the power supply point of view, the PA 6 behaves like a resistive load. Therefore $V_{pa} = R_{pa}(i_{sw} + i_{lin})$, i.e., the PA 6 voltage is set by the sum of the currents supplied by the switching part 32 and the linear part 34. In this example, $R_{pa}$ is assumed to equal two Ohms. The switching part 32 contributes the DC component $i_{sw}$ (e.g., 1 Amp) and the linear part 34 contributes the AC component $i_{lin}$, a 15 MHz current sine wave representing the fast modulation. The second waveform from the top shows the current contribution of the switching part 32, i.e., the 1 Amp constant current $i_{sw}$. The third waveform from the top depicts the current contribution of the linear part 34, that is, the AC component $i_{lin}$ (the 15 MHz current sine wave). The bottom waveform shows that the resulting PA 6 current $i_{pa}$ has a DC component from the switching part 32 and an AC component from the linear part 34.

In FIG. 12 it is assumed that the switching stage 32 has a switching frequency=5 MHz and duty cycle=0.5. The top waveform shows the PWM 32A voltage applied on the inductor L at node pwm. The second waveform from the top shows the resulting PA 6 voltage $V_{pa}$. As was noted above, it is assumed that the PA 6 behaves like a resistive load and, therefore, $V_{pa} = R_{pa}(i_{sw} + i_{lin})$, i.e., the PA 6 voltage is set by the sum of the currents supplied by the switching part 32 and the linear part 34. As before, $R_{pa}$ is assumed to equal two Ohms. The switching part contributes the DC component $i_{sw}$ (1 Amp) having a triangular AC component. The linear part contributes the AC component $i_{lin}$, such as the 15 MHz current sine wave representing the fast modulation. The third waveform from top shows the current contribution of the switching part 32, i.e., the inductor current $i_L = i_{sw}$. In this case the current is not constant, as in the ideal case depicted in FIG. 11, but has the triangular shape encountered in switching converters. The switching part 32 contributes the DC component and the triangular AC component (the inductor current ripple). The fourth waveform from top shows the current contribution of the linear part 34, i.e., the AC component $i_{lin}$ (15 MHz sinusoidal component). Note that in this case the linear part 34 contributes only the 15 MHz sinusoidal component, unlike the corresponding waveform from FIG. 9, where the AC component to compensate for the inductor current ripple can also be seen. The bottom waveform shows that the resulting PA 6 current $i_{pa}$ has the DC component and the AC triangular component from the switching part 32 (as seen from the underlying waveform designated ACrip), and the AC component from the linear part 34. Note that the AC triangular component is not compensated for by the linear stage 34 in this embodiment due to its current source characteristic, although it may be compensated by suitably controlling the VCCS.

The circuits shown in FIGS. 13 and 16 illustrate that the linear part 34, constructed with two VCCS 34A and 34A', or with two VCCS 34B and 34B', respectively, sources current from $V_{bat}$ and sinks current to ground. The operation is shown in the waveform diagrams of FIGS. 14 and 15, and 17 and 18, respectively.

The circuit representations in FIGS. 13 and 16, and their corresponding waveforms, illustrate the source/sink behavior of the VCVS 34A and the VCCS 34B, respectively, and model the behavior of the Power Operational Amplifier and the Operational Transconductance Amplifier, respectively. Note that the two VCVS 34A in FIG. 13 are not active at the same time, and are preferably placed in a high impedance state when not active.

Figure 13A:
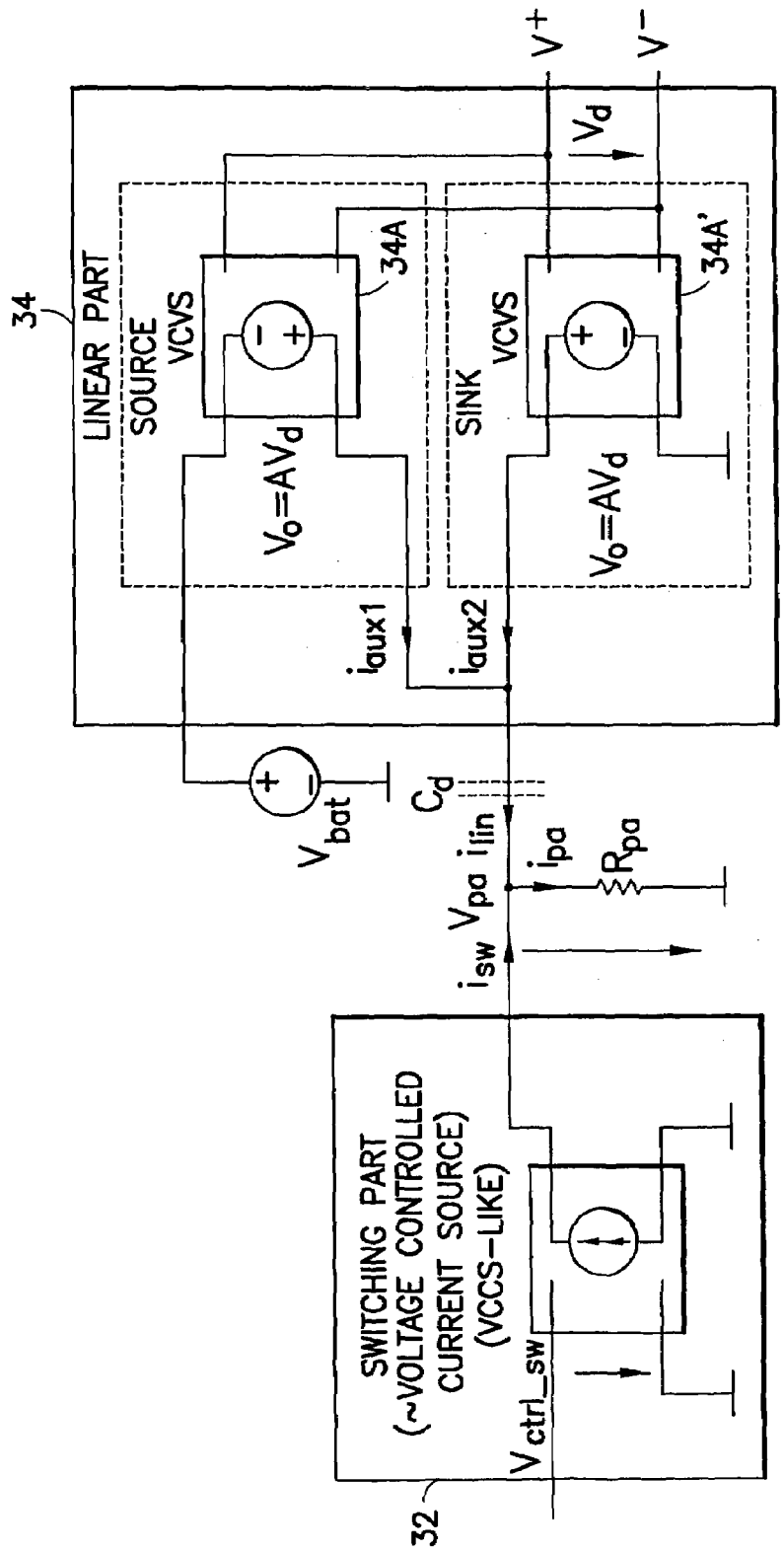
FIGS. 13A and 13B, collectively referred to as FIG. 13, relate to the circuits shown in FIGS. 6C and 6D, where
Figure 13B:
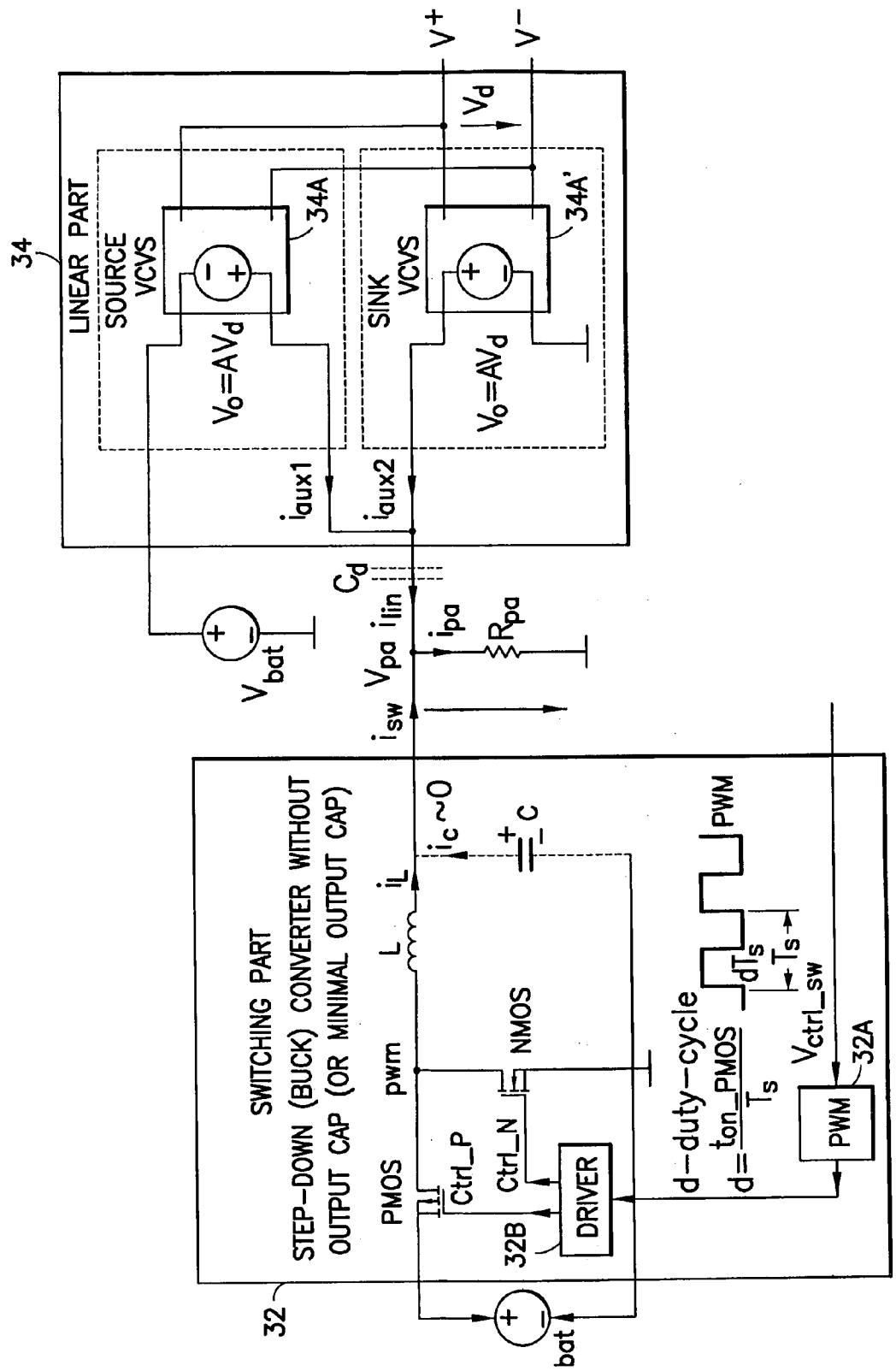

More specifically, FIGS. 13A and 13B illustrate this embodiment with ideal sources, and the explanation given above for the circuit of FIG. 7 applies here as well. A difference between the circuits is that in the embodiment of FIG. 13 the voltage sources VCVS 34A and 34A' are uni-directional (one sources current, the other one sinks current), while in FIG. 7 the voltage source 34A is bi-directional (source and sink). The decoupling capacitor $C_d$ may be included to ensure that the linear part 34 contributes only the AC component.

Figure 14:
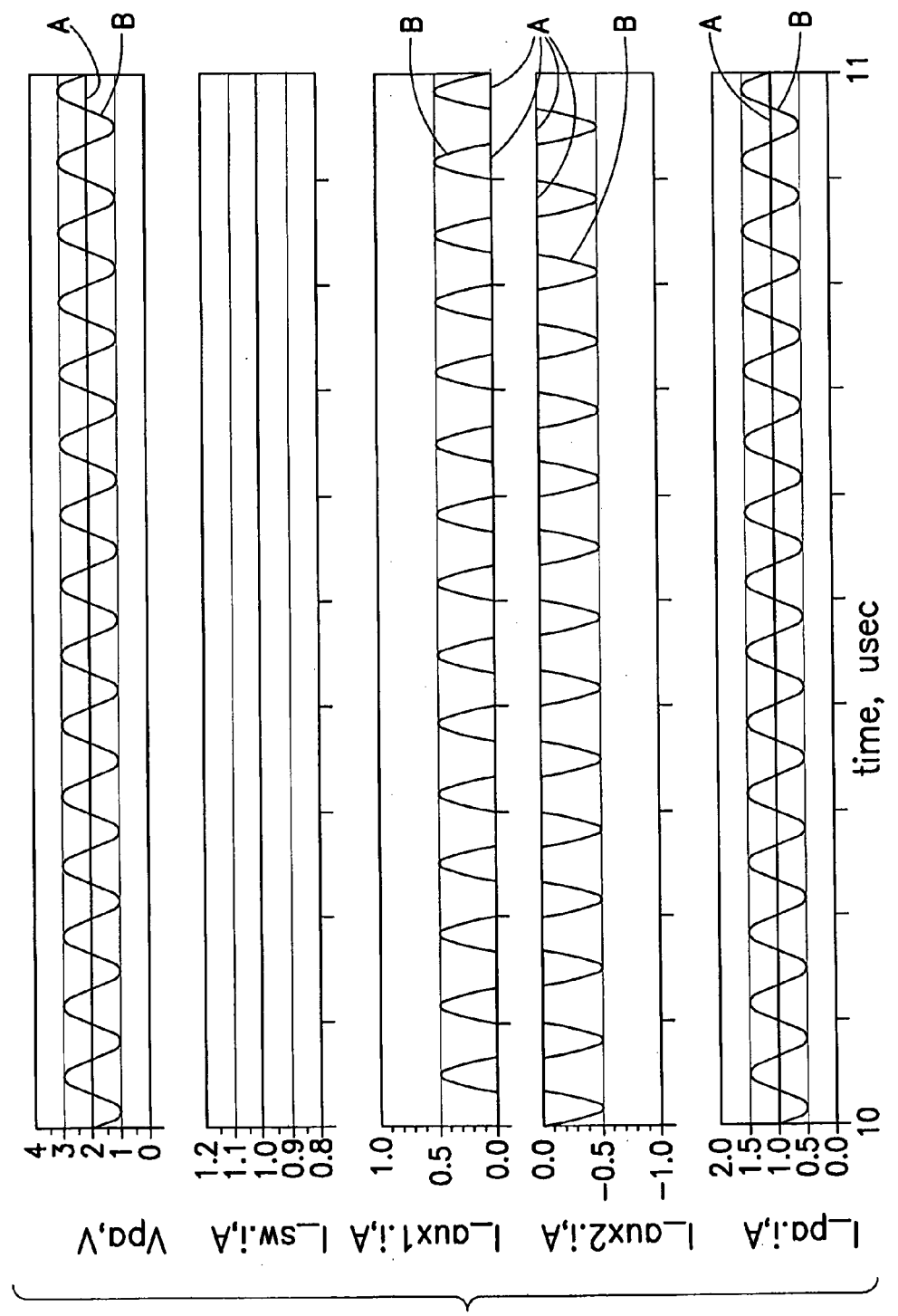
FIG. 14 shows waveforms that correspond to the operation of the circuit of FIG. 13.
Figure 15:
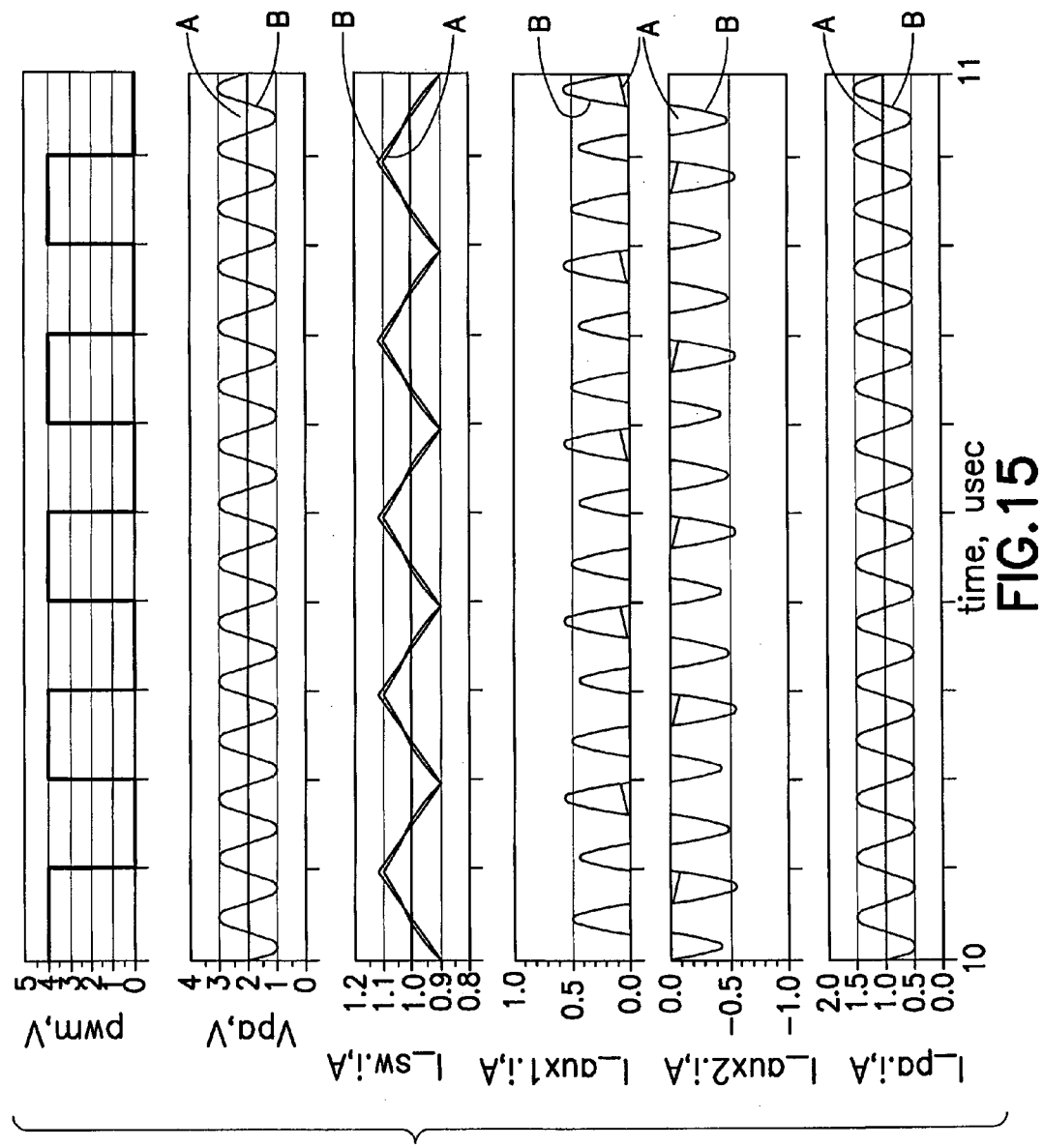
FIG. 15 also shows waveforms that correspond to the operation of the circuit of FIG. 13.

With regard to the simulated waveform diagrams of FIGS. 14 and 15, a similar explanation as was given above for FIGS. 8 and 9 also applies, except that the contribution of the linear part 34 $i_{lin}$ is partitioned into $i_{aux1}$ (source) and $i_{aux2}$ (sink). It should be noted again that the two voltage sources 34A and 34A' (source and sink) are preferably placed in a high impedance state when their respective current is zero (i.e., when they are not active).

Figure 16A:
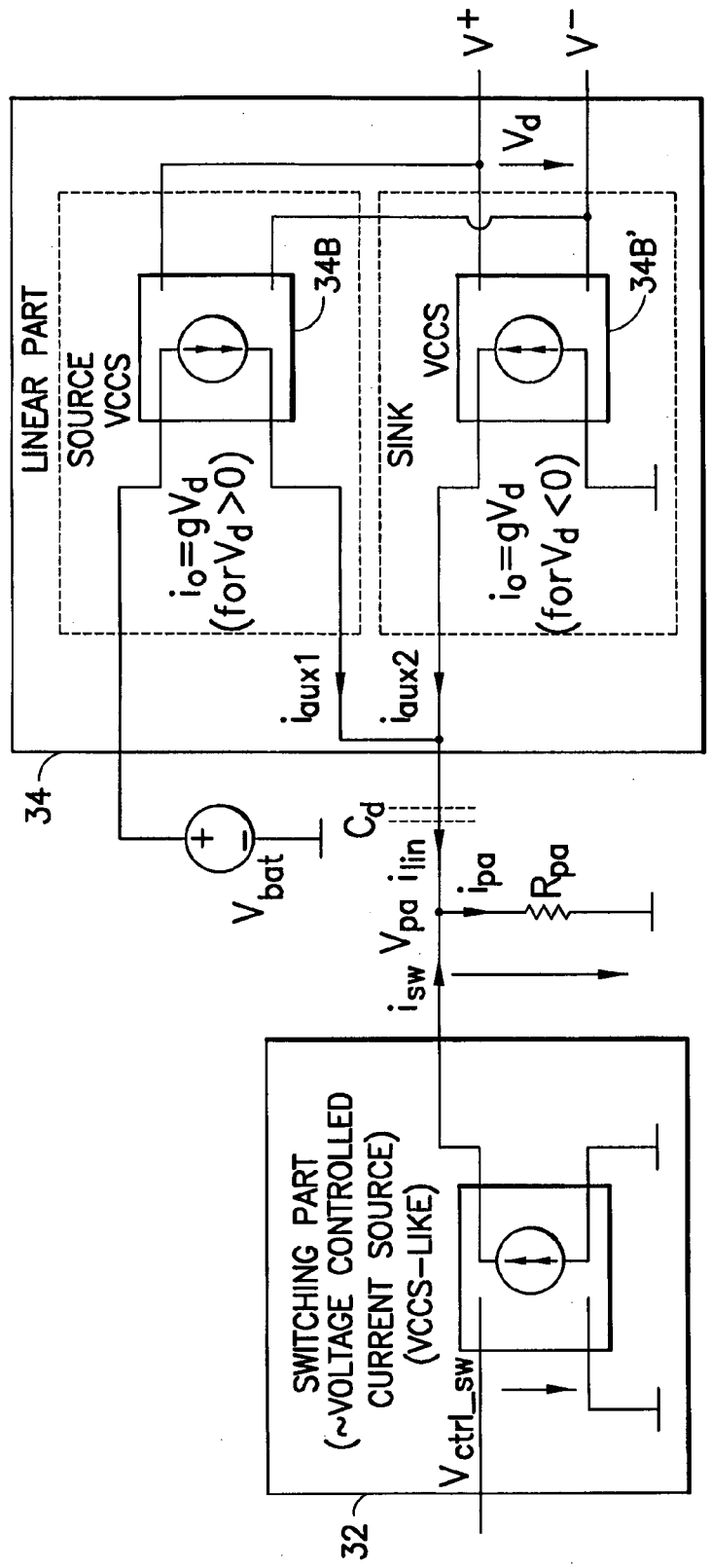
FIGS. 16A and 16B, collectively referred to as FIG. 16, relate to the circuits shown in FIGS. 6E and 6F, where
Figure 16B:
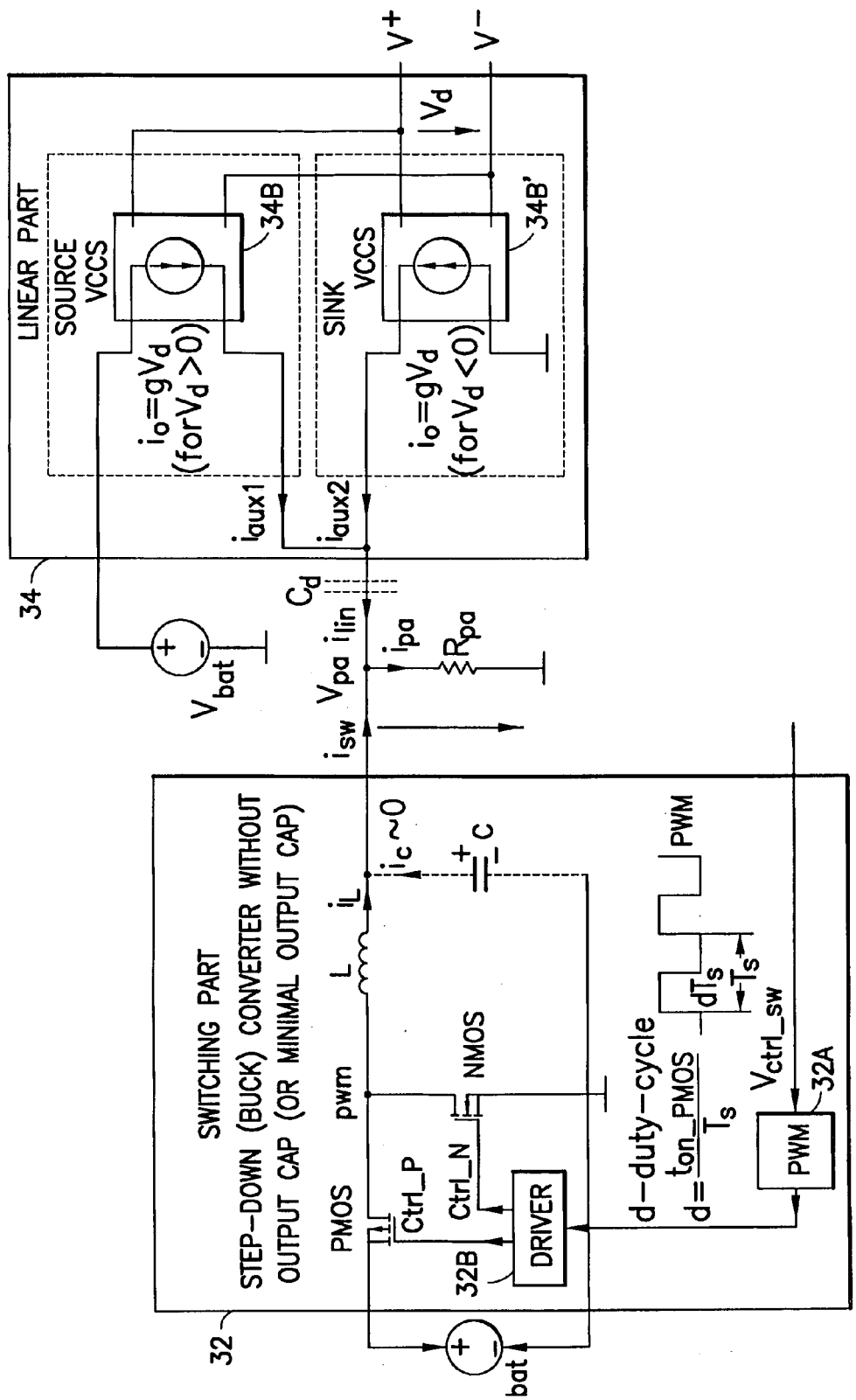

FIGS. 16A and 16B illustrate this embodiment of the invention with ideal sources, and the explanation given above for the circuit of FIG. 10 applies here as well. A difference between the circuits is that in the embodiment of FIG. 16 the current sources VCCS 34B and 34B' are uni-directional (one sources current, the other one sinks current), while in FIG. 10 the current source 34B is bi-directional (source and sink). The decoupling capacitor $C_d$ may be included to ensure that the linear part 34 contributes only the AC component.

Figure 17:
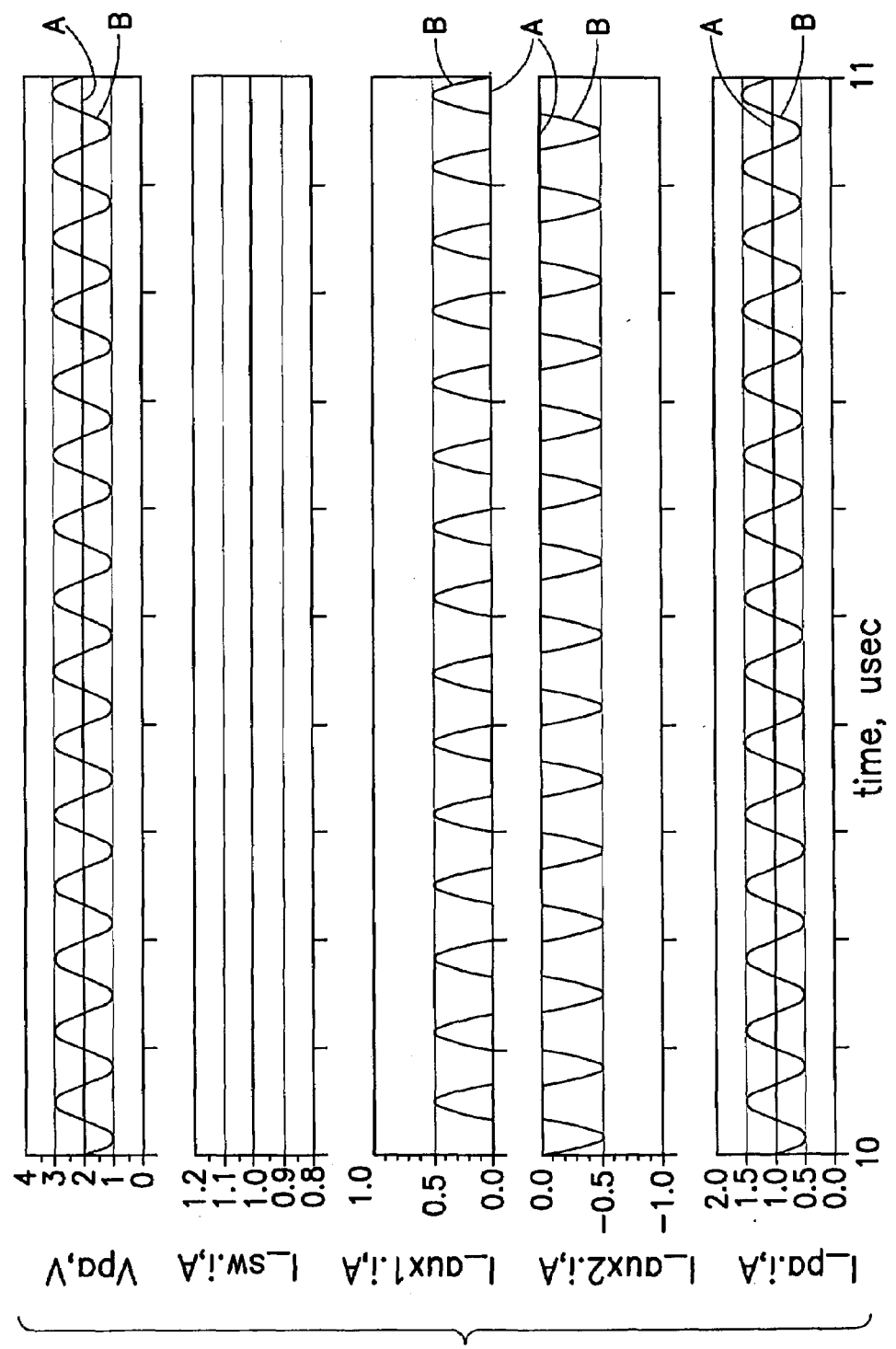
FIG. 17 shows waveforms that correspond to the operation of the circuit of FIG. 16.
Figure 18:
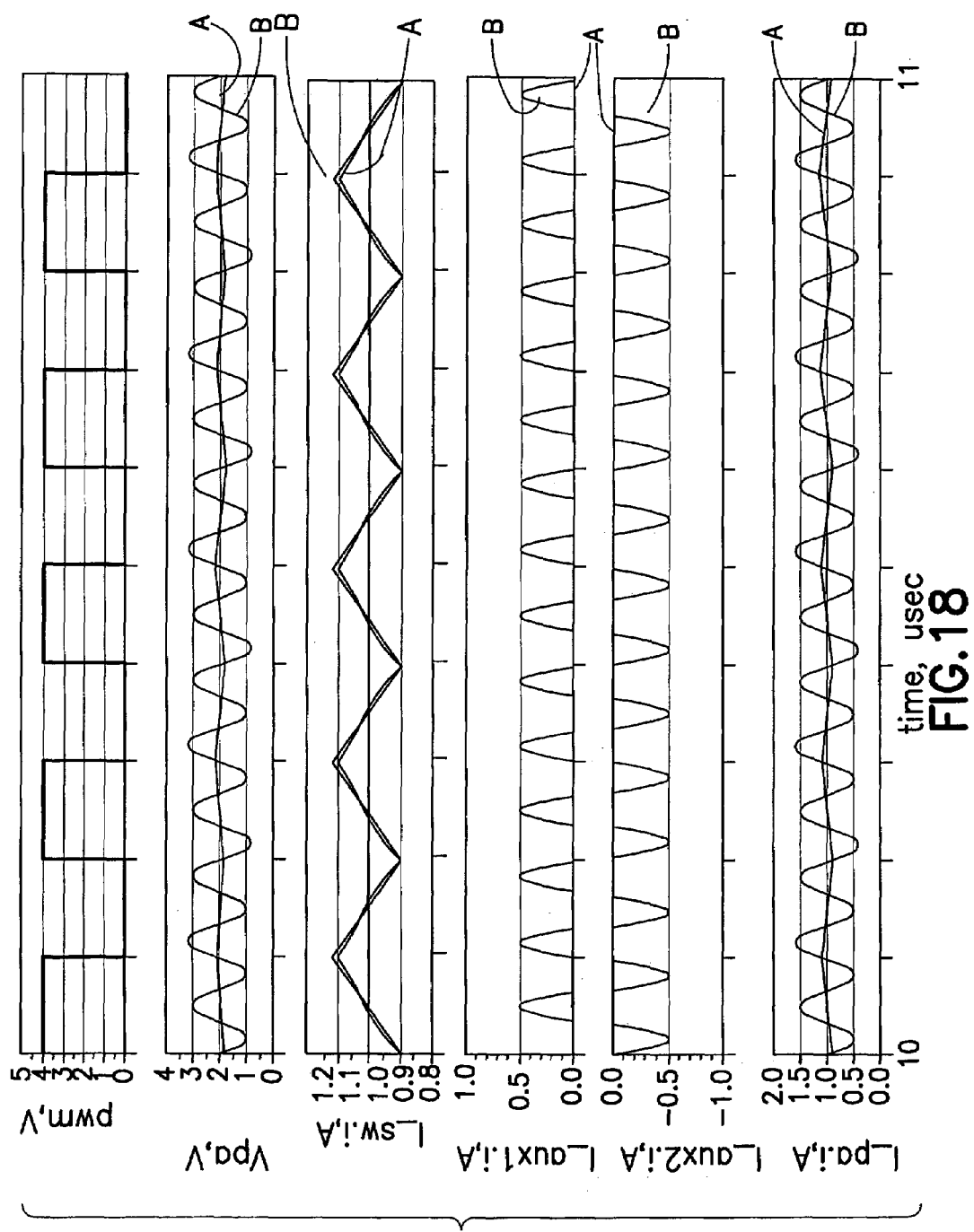
FIG. 18 also shows waveforms that correspond to the operation of the circuit of FIG. 16.

With regard to the simulated waveform diagrams of FIGS. 17 and 18, a similar explanation as was given above for FIGS. 11 and 12 also applies, except that the contribution of the linear part 34 $i_{lin}$ is partitioned into $i_{aux1}$ (source) and $i_{aux2}$ (sink).

Figure 21:
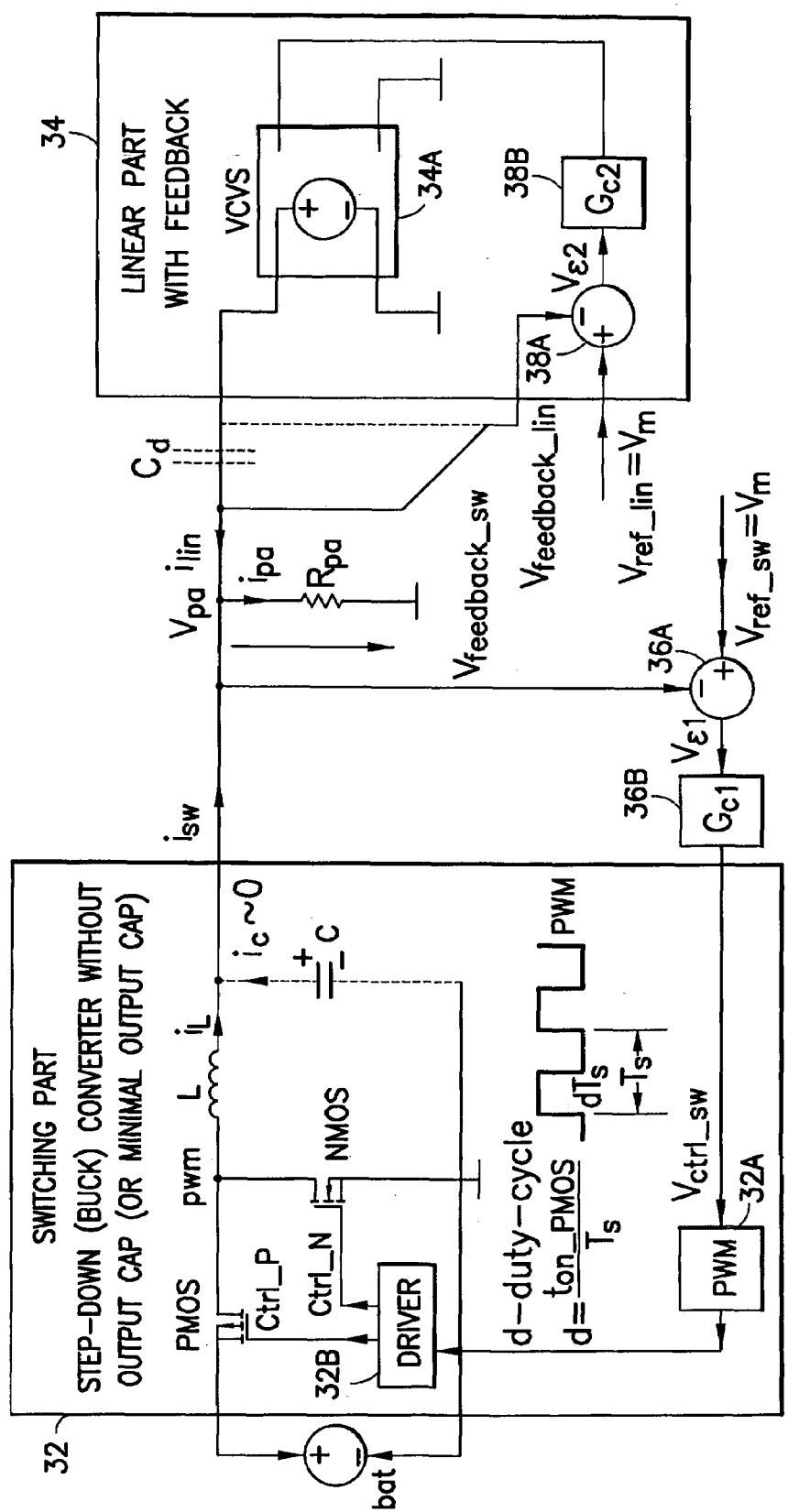
FIG. 21 illustrates a first control configuration wherein both the switching part and the linear part are operated closed-loop and have as a reference a modulating signal $V_m$.
Figure 22:
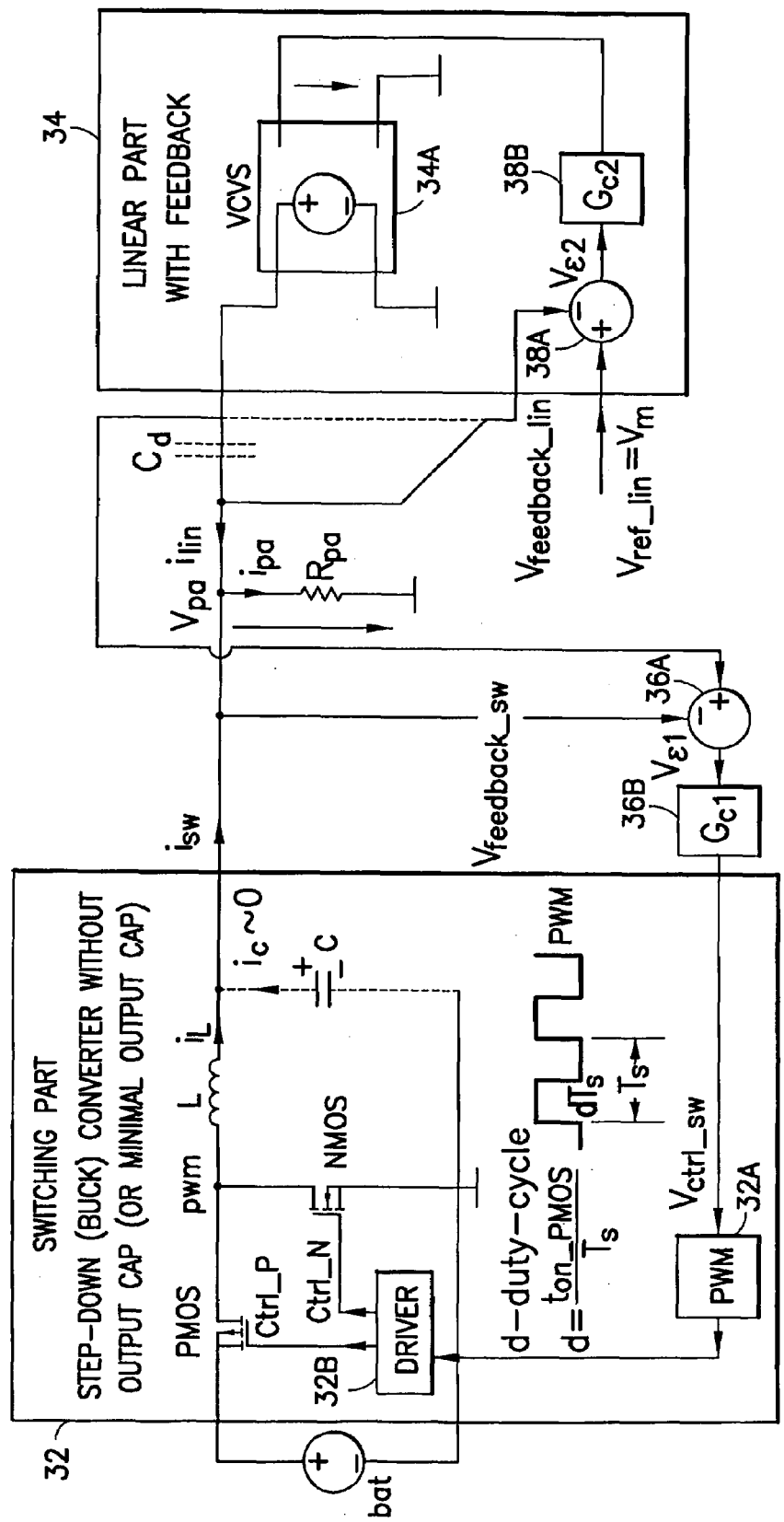
FIG. 22 illustrates a second control configuration wherein both the switching part and the linear part are operated closed-loop, where the linear part has as a reference the modulating signal $V_m$ and the switching part has as reference the output of the linear part.
Figure 23:
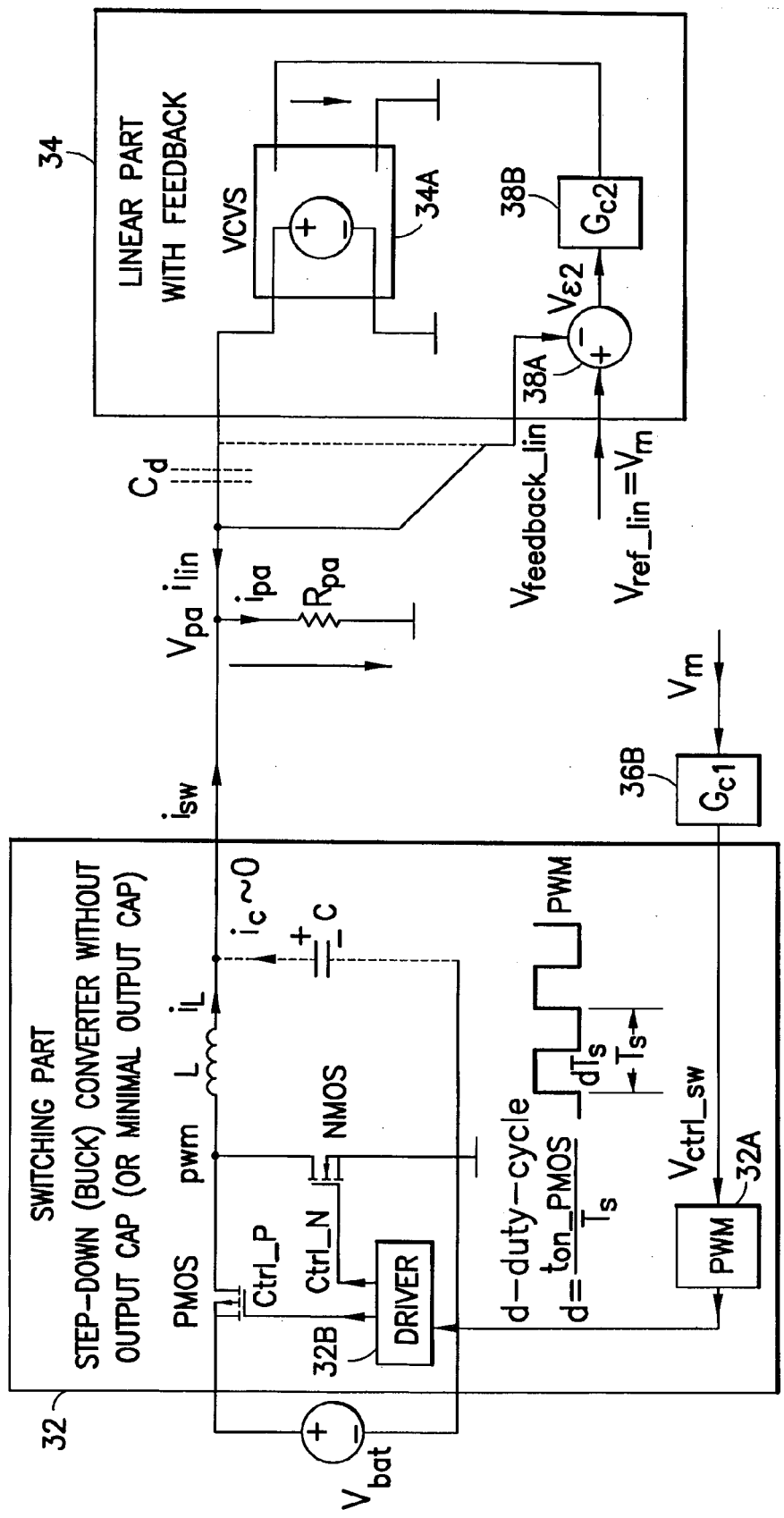
FIG. 23 illustrates a third control configuration wherein only the linear part operates closed-loop and has as a reference the modulating signal $V_m$, and where the switching part operates open-loop, and only the modulating signal $V_m$ information is used to generate the duty cycle of the switching part.

It is noted that FIGS. 7 and 10 are representations of interconnections of the power stages only (switching part 32 and linear part 34), without control considerations. The switching part 32 is represented as a block that is controlled by control voltage $V_{ctrl}$. The linear part 34 is represented as a block controlled by the differential voltage $V_d$. FIGS. 21, 22 and 23 illustrate three non-limiting embodiments of control techniques to close the control loops.

In FIG. 21 the switching part 32 operates with voltage-mode control. The controller is composed of a control block 36A that generates an error signal $V_{e1}$ and a block 36B with a frequency-dependent characteristic $G_{c1}(s)$ that has as its input the error signal $V_{e1}$ and as its output the control voltage $V_{ctrl\_sw}$ for the switching part 32. The error voltage $V_{e1}$ is the difference between the reference voltage $V_{ref\_sw}$, which is the modulating signal $V_m$, and the feedback signal $V_{feedback\_sw}$, which is the output voltage $V_{pa}$. The controller (components 36A, 36B) in this case may be physically implemented as an operational amplifier with an R-C compensation network to obtain the characteristic $G_{c1}(s)$.

The linear part 34 uses the modulating signal $V_m$ as the reference $V_{ref\_lin}$. The feedback voltage $V_{feedback\_lin}$ is the output voltage $V_{pa}$. The feedback voltage $V_{feedback\_lin}$ may be taken as well before the decoupling capacitor $C_d$ (if present), as shown with the dashed line. Similar to the switching part 32, the controller in this case is composed of a block 38A generating error signal $V_{e2}$ and a block 38B with a frequency-dependent characteristic $G_{c2}(s)$. As the linear part 34 is in fact preferably implemented with a Power Operational Amplifier, as in FIG. 19B, the control loop can be closed around it by adding an R-C compensation network to obtain the characteristic $G_{c2}(s)$, as one skilled in the art should realize. Note that the VCVS 34A is included simply to show the voltage source characteristic of the linear stage 34, it is not the same VCVS shown in FIG. 7. The block labeled as "Linear part with feedback" is in fact a representation of the Power Operational Amplifier with the R-C compensation network.

Note that the same considerations as above apply for closing the loop when the linear stage 34 is constructed with the VCCS 34B (e.g., FIG. 10) and the OTA shown in FIG. 20B.

In FIG. 22 the only significant difference versus FIG. 21 is that the reference signal of the switching part 32 is taken from the output of the linear part 34 (before the decoupling capacitor if present). The same considerations apply when the linear stage 34 uses the VCCS 34B and OTA. In this embodiment is clear that the linear part 34 has as its reference the modulating signal $V_m$, the AM signal, while the switching part 32 has as its reference the output of the linear part 34 (i.e., it is 'slaved' to the linear part 34).

In the embodiment of FIG. 23 the switching part 32 operates open-loop, meaning that only the modulating signal $V_m$ is used to generate the PWM duty cycle d, and not the error signal $V_{e1}=V_m-V_{pa}$. This exemplary embodiment may be particularly useful if stability problems are potentially present with the two-loop control systems depicted in FIGS. 21 and 22. As before, the same considerations apply when the linear stage 34 uses the VCCS 34B and the OTA.

The foregoing description of the embodiments of this invention provide a solution for achieving the fast modulation of the PA 6 power supply, where the fast modulation is provided primarily by the linear part 34, and uses the Buck converter with no or minimal filtering capacitance. However, it should be noted that the concept of connecting in parallel a switching stage with a linear stage can be applied, and is useful, also in the case where a Buck converter is used in its conventional form, i.e., with a substantial output filtering capacitance C, and hence with a voltage source characteristic. For example, the RF transmitter for a GSM/EDGE case can be addressed with a fast switching converter, based on a Buck converter with voltage mode control. In this exemplary case the necessary bandwidth can be achieved, however the dynamics are not ideal (i.e., the reference-to-output transfer function is not flat, but instead may exhibit peaking) and thus the reference tracking is not optimal. Moreover, the output voltage ripple due to the converter switching action creates a spurious RF signal. Therefore, a linear stage 34, connected in parallel with the Buck converter, can be used to compensate for the non-ideal dynamics of the switching converter by "aiding" it and improving its tracking capability. In practice the linear part 34 may also be used to improve (widen) the bandwidth, but its main role is to correct the reference-to-output characteristic already provided by the switching part 32. Moreover, the linear part 34 may compensate also for the output-voltage switching ripple (at least in a manner sufficient to meet the RF spurious requirements), by injecting a current to compensate for the inductor current ripple.

For the above reasons, it should be appreciated that the embodiments generally represented by FIG. 5 may be extended to include circuit structures where the switching part 32 is a "normal" Buck converter, i.e., where the output filter capacitance C is sufficiently large so that the Buck converter behaves like a voltage source.

Based on the foregoing, it can be appreciated that the foregoing embodiments of this invention encompass circuit structures based on the Buck switched mode converter with no or but minimal filtering capacitance C, i.e., where the output filter capacitance C is small enough (or absent) so the Buck converter behaves substantially like a current source, where the linear part 34 alone is able to determine the bandwidth of the PA 6 supply, i.e. even with very slow switching part 32, the linear part 34 is able to modulate due to the absence/minimal Buck converter filtering capacitor; where the linear part 34 provides also the triangular AC component of the inductor current; and where the linear part 34 compensates for the switching ripple.

Based on the foregoing, it can be appreciated that the foregoing embodiments of this invention also encompass circuit structures that are preferably based on the Buck switched mode converter with significant filtering capacitance C, i.e., where the output filter capacitance C is sufficiently large so that the Buck converter behaves substantially like a voltage source. Thus, the embodiments of this invention also encompass circuit structures based on a "normal" Buck converter circuit topology with filtering capacitance; where the bandwidth is determined primarily by the switching converter. In this case the linear part 34 may be used to improve the bandwidth, but in a more limited way as the bandwidth is actually limited by the filtering capacitor C of the switching regulator. An important role of the linear part 34 in these embodiments is to aid and correct the dynamics of the switching part 32 (the Buck converter). In this embodiment the linear part 34 may also compensate for the switching ripple.

Aspects of this invention are based on the observation that the high frequency components in, as examples, the EDGE and WCDMA envelope have very low amplitude, while the majority of the energy is at DC and low frequencies. The low bandwidth switching part 32 processes the bulk of the power (DC and low frequency components) with high efficiency, while the wider bandwidth linear part 34 processes with lower efficiency only a fraction of the power (the power corresponding to the high frequency components). Therefore, it becomes possible to achieve the required bandwidth while still providing good efficiency. In general, the obtainable efficiency is less than would be achieved with a purely switching power supply, but still much greater than would be achieved with a purely linear regulator-based power supply.

The principles of this invention apply without regard for the actual implementation of the switching part 32 and/or the linear part 34, and can be applied generally to transmitter architectures where the PA 6 supply voltage needs to be modulated in amplitude. The teachings of this invention are not restricted to GSM/EDGE and WCDMA systems, but can be extended also to other systems (e.g. to CDMA systems). The teachings of this invention are not restricted to systems using a Class E PA 6, can be applied also to systems using other types of saturated PAs.

Still further aspects of this invention, described in greater detail below, are directed to coupling to and supplying several PAs 6 in a multi-mode transmitter, as well as control for same methods.

Figure 24:
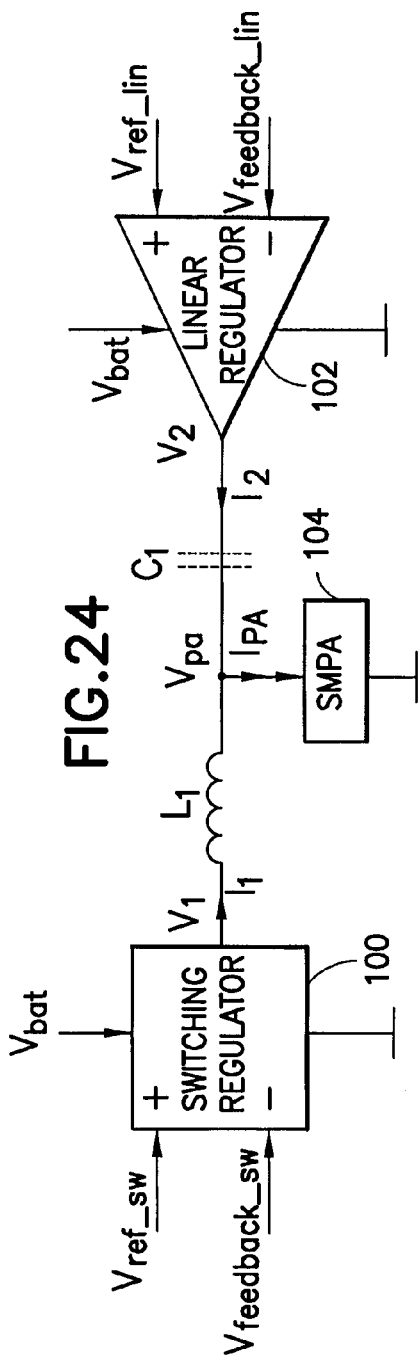
FIG. 24 shows, further in accordance with embodiments of this invention, the parallel connection of a switching regulator and a linear regulator via an auxiliary inductor $L_1$ and an (optional) auxiliary capacitor $C_1$.

Referring now to FIG. 24, there is shown an embodiment wherein a switching regulator 100 and a linear regulator 102 are coupled in parallel to a SMPA 104 (e.g., a Class E PA) by means of an additional inductor $L_1$ (i.e, additional to the conventional switching part 32 inductor L shown in, for example, FIG. 7B) and an (optional) capacitor $C_1$. The PA 104 supply voltage $V_{pa}$ is programmed with high accuracy by the linear regulator 102. However, the instantaneous output voltage $V_1$ of the switching regulator 100 cannot be accurately fixed at same value due to the low bandwidth, switching ripple and noise. Therefore, the additional inductor $L_1$ is introduced to accommodate the instantaneous voltage difference $V_{pa}$-$V_1$. The average voltage over $L_1$ must be zero, hence the average of $V_1$ equals $V_{pa}$.

If the decoupling capacitor $C_1$ is present, the linear regulator 102 can provide only AC components in a certain range of frequencies, which preferably complement the lower bandwidth of the switching regulator 100 to obtain the desired overall bandwidth.

If $C_1$ is not present, the linear regulator 102 can also provide DC and low frequency components. This may be particularly advantageous under certain conditions, for example when the PA 104 voltage $V_{pa}$ should be as close as possible to the battery voltage $V_{bat}$.

One such situation is in the GSM case, at maximum RF output power (the PA 104 needs minimum voltage, e.g., 2.7V), with low battery voltage (e.g., 2.9V). In this case the difference between the input voltage and the output voltage of any regulator interposed between the battery and the PA 104 is very low (only 0.2V in this example). This is a very difficult value to obtain with the switching regulator 100 (considering the voltage drop on one power device, plus the two inductors L and $L_1$, at a duty cycle<100%). In this particular case, the linear regulator 102 can be used to provide the supply voltage nearer to the battery voltage, and thus the linear regulator 102 provides all of the power (DC component, and no capacitor $C_1$). While in this particular case (GSM, max output power, low battery voltage) the efficiency would not be affected because the voltage drop on the linear regulator 102 is small, at lower GSM power levels (i.e. larger drop on the linear regulator 102) the efficiency would be degraded. Therefore, at lower power levels it is more advantageous to use the switching regulator 100 to provide all of the power (DC component).

In FIG. 24 the supply voltage for the linear regulator 102 is $V_{bat}$, the same as for the switching regulator 100. While this may be optimum from an implementation point of view, it may not be optimal from an efficiency point of view. At lower power levels, where $V_{m\_pk}$ is much lower than $V_{bat}$, the voltage drop on the linear regulator 102 is large and its efficiency is poor. Therefore, a more efficient technique pre-regulates (with high efficiency) the supply voltage of the linear regulator 102 at some level, e.g., 200-300 mV above the peak value of the envelope $V_{m\_pk}$ (see FIG. 2).

Figure 4B:
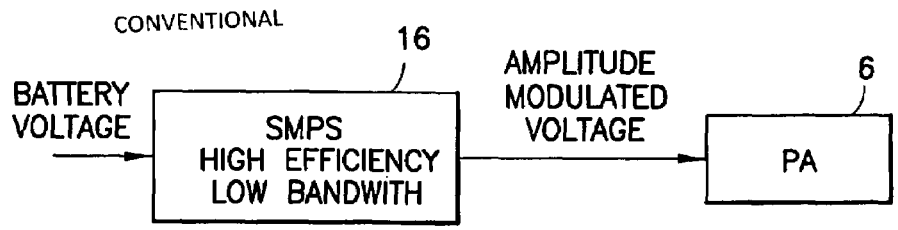

As seen from FIGS. 3 and 4, each of the two building blocks (switching and linear) of the hybrid regulator has its own control loop. The overall control must be made in such a way that the two blocks complement each other. Two possible control schemes are shown in FIG. 25.

In FIG. 25A both regulators 100, 102 are 'master', as each has the modulating signal $V_m$ as a reference and each regulator 100, 102 receives its feedback signal ($V_{feedback\_sw}$, $V_{feedback\_ln}$) from its own output.

In FIG. 25B the linear regulator 102 is the 'master', i.e. it has as a reference signal the modulating signal $V_m$ and its own output as the feedback signal. The switching regulator 100 is a 'slave', meaning that it has as a reference signal the voltage applied to the SMPA 104 by the linear regulator 102, and attempts to follow it as accurately as possible.

These embodiments of this invention are particularly well suited for application in a multi-mode transmitter, as explained below.

As a first non-limiting example, in GSM the RF envelope is constant, so the voltage supplied to the PA 104 is constant and its level is adjusted according to the desired power level. The main function of the SMPA 104 power supply in this case is power control. In principle using only the switching regulator 100 would be sufficient. However, the switching action generates output voltage ripple and noise, which are seen as spurious signals in the RF spectrum at SMPA 104 output. In this mode the linear regulator 102 may be employed, if needed, to compensate for the output voltage ripple of the switching regulator 100. By doing so, it is also possible to relax the specification of the output voltage ripple for the switching regulator 100. For example, if one assumed a typical voltage ripple specification of 5 mV for the switching regulator 100, with ripple compensation supplied by the linear regulator 102 the specification may possibly be relaxed to 50 mV, allowing for smaller LC components in the switching regulator 100 and/or faster dynamics of the switching regulator 100. In this case the switching regulator 100 processes almost all of the required SMPA power, while the linear regulator 102 processes very little (only that needed for ripple compensation).

In the EDGE system or, in general, any system having a variable RF envelope with moderately high dynamics (e.g., required BW>1 MHz), the main functions of the SMPA 104 power supply are power control and envelope tracking. It can be shown that a purely switching regulator with a 6-7 MHz switching frequency is capable of tracking with relatively good accuracy the EDGE RF envelope. However, the system is not robust when using a purely switching regulator, and may exhibit sensitivity to, for example, peaking in the reference-to-output transfer function of the switching regulator 100, and to variations of the SMPA 104 load with the supply voltage (generally the resistance of the SMPA increases as the supply voltage decreases). In addition, there is also the problem of the output voltage ripple, as discussed above. In accordance with this aspect of the invention the linear regulator 102 can be used, if needed, to compensate for the non-optimal dynamics of the switching regulator 100, the SMPA 104 load variation and the switching ripple. If the switching frequency of the switching regulator 100 is sufficiently high enough to allow for good tracking capability, most of the power is processed by the switching regulator 100. However, it is also possible to use a switching regulator 100 with a lower switching frequency, hence with a lower bandwidth, in which case the proportion of the power processed by the linear regulator 102 increases to compensate for the reduction by the switching regulator 100.

In the WCDMA system or, in general, any system that exhibits a variable RF envelope with high dynamics (e.g., a required BW>15 MHz) the main functions of the SMPA 104 power supply are both power control and envelope tracking. However, since the required bandwidth is much higher that for the EDGE system, the use of only the switching regulator 100 (in CMOS technology) is not adequate, and the use of the linear regulator 102 becomes important to provide the required bandwidth. As in the EDGE case, the linear regulator 102 can also compensate for the switching ripple and the SMPA 104 load variation.

A further utility gained from the use of embodiments of this invention is an ability to provide multi-mode operation with a plurality of PAs. One non-limiting example is the Class E GSM/EDGE PA 104A and the Class E WCDMA PA 104B shown in FIG. 26. In this case all of the PAs 104A, 104B are connected on same supply line at the output of the linear regulator 102. This embodiment assumes, as do the embodiments of FIGS. 27, 29 and 30, that there is a mechanism present (e.g., a switch) to enable only one PA 104A or 104B at a time.

Note that the PAs 104A and 104B are not limited to being Class E PAs, as these are shown for convenience only. The same is true for the embodiments shown in FIGS. 27,29 and 30.

In FIG. 26A both regulators 100, 102 can be viewed as 'masters', i.e., both have as their reference the modulating signal $V_m$ and both have their own respective output voltages to provide their feedback information. In FIG. 26B the linear regulator 102 is the 'master' and the switching regulator 100 is the 'slave', meaning that its reference signal is the output of the linear regulator, $V_{pa}$.

FIG. 27 shows additional multi-mode configurations, where the GSM/EDGE PA 104A is connected at the output of the switching regulator 100 (between the output and $L_1$) and the WCDMA PA 104B is connected at the output of the linear regulator 102. This configuration is useful for, as was noted previously, in GSM/EDGE the required performance may be achieved with the purely switching regulator 100. With this assumption, in GSM/EDGE one uses only the switching regulator 100 and disables the linear regulator 102. This has a positive impact on efficiency, because losses introduced by inductor $L_1$ are eliminated. It also permits one to obtain a maximum GSM/EDGE PA supply voltage $V_1$ that is nearer to the battery voltage $V_{bat}$, as the voltage drop on $L_1$ is eliminated. The inductor $L_1$ can be smaller, as it has to handle only the lesser PA 104B current in the WCDMA mode of operation. In this embodiment the linear regulator 102 is enabled only in the WCDMA mode.

Figure 28:
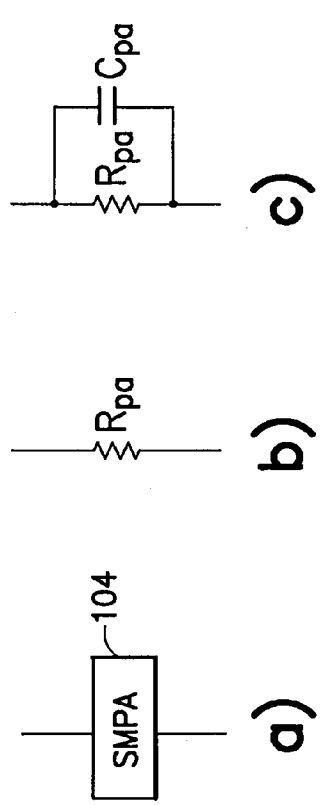
FIG. 28 illustrates a SMPA as (a) a block representation, (b) modeled by its equivalent DC resistance $R_{pa}$, and (c) modeled by its equivalent DC resistance $R_{pa}$ in parallel with capacitance $C_{pa}$ used to achieve PA stability.

Note that if all of the PAs 104A and 104B are connected to the same supply line, as was shown in FIG. 26, the total decoupling capacitance may be too large. The PA 104 (a Class E PA as a non-limiting example) can be modeled, in a first approximation and from a regulator point of view, by its equivalent DC resistance $R_{pa}$, as shown in FIG. 28. In practice, and for PA stability reasons, it is typically necessary to connect at least one decoupling capacitor $C_{pa}$ in parallel with the PA 104. If there are several PAs 104 connected on same supply line, it may be possible to use one or more common (shared) decoupling capacitors. In that case, the connection shown in FIG. 26 is possible. However, if each PA 104 must have its own decoupling capacitors, e.g., because the capacitors must be placed within a PA module, then the total decoupling capacitance may become excessive, making it impossible to achieve the wide bandwidth needed in, for example, the WCDMA mode of operation.

One solution to this problem is use switches to disconnect from the supply line the inactive PA(s), or at least their decoupling capacitors. Another possible solution is to connect the PAs 104A, 104B on independent supply lines, for example as shown in FIG. 27.

In FIG. 27A both regulators 104A, 104B are connected as 'masters'. In GSM/EDGE, and assuming that acceptable performance can be obtained, the linear regulator 102 may be disabled and only the switching regulator 100 is used. However, it may be possible to also use the linear regulator 102, by-passing $L_1$, for (some) ripple compensation and dynamic performance improvement. If this case the linear regulator 102 is enabled as well, and its feedback information is $V_1$ applied through Switch 1 (SW1) in the GSM/EDGE position. In the WCDMA mode both regulators 100, 102 are enabled and the feedback information for the linear regulator is $V_{pa}$ (SW1 is in the WCDMA position).

In the embodiment shown in FIG. 27B the switching regulator 100 is connected as a 'slave' for the WCDMA case (both SW1 and SW2 are in the WCDMA position), and receives its $V_{ref\_sw}$ signal via SW2 from the output of the linear regulator 102. In the GSM/EDGE mode (both SW1 and SW2 are in the GSM/EDGE position) the configuration and operating considerations are as described above for FIG. 27A.

FIG. 29 shows additional multi-mode configurations, where the PAs 104A, 104B are connected to independent supply lines at the output of individual linear regulators 102A, 102B. This configuration is an extension of the multi-mode configuration shown in FIG. 26. There is only one switching regulator 100, and the PAs 104A, 104B are connected on individual supply lines each assisted by an associated linear regulator 102A, 102B, respectively, and isolated via associated inductors $L_1$ and $L_2$, respectively. This configuration aids in overcoming the problem of excessive decoupling capacitance $C_{pa}$ described earlier with respect to FIG. 28.

Figure 29A:
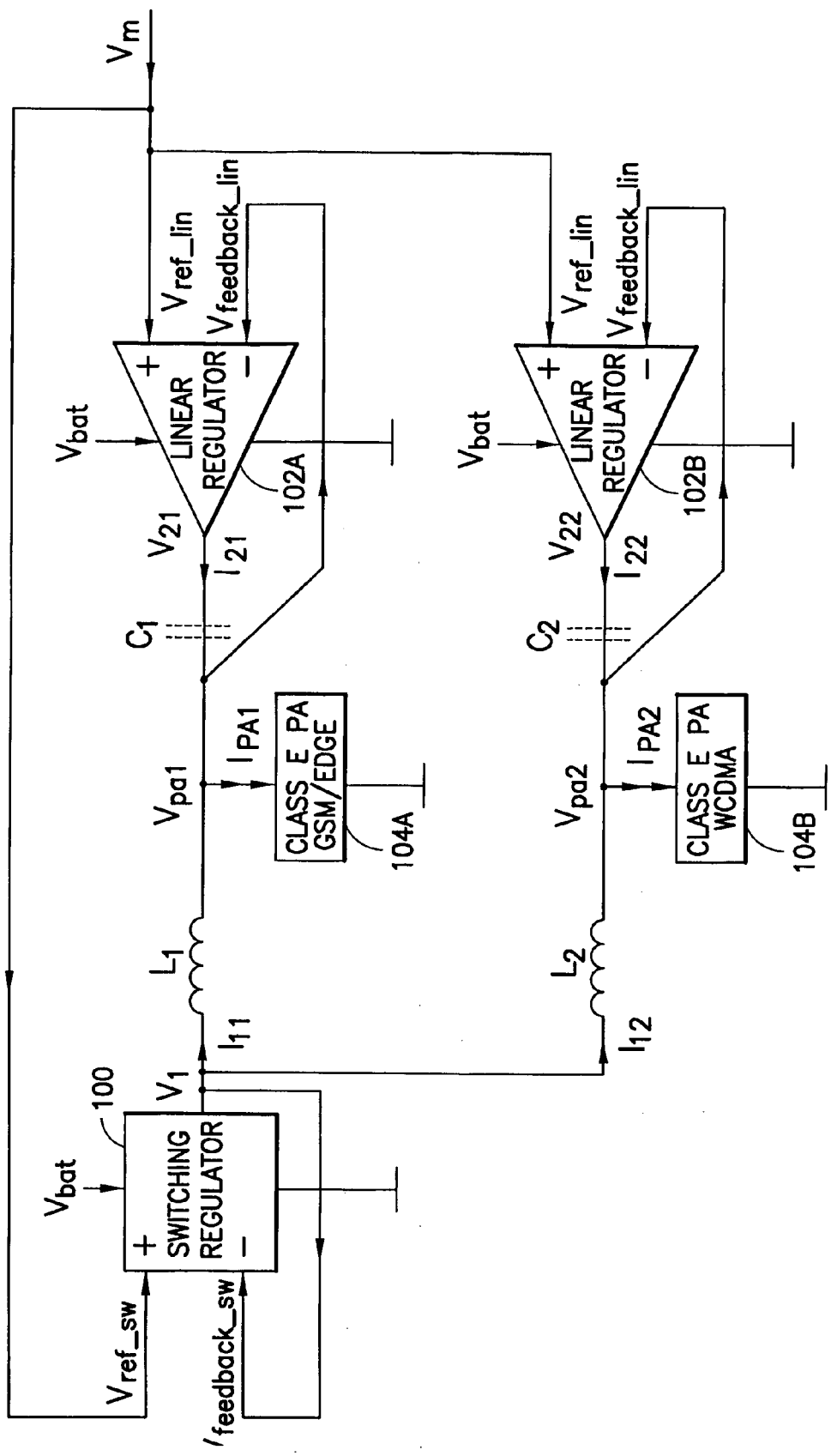
FIGS. 29A and 29B, collectively referred to as FIG. 29, show a third multi-mode control block diagram in accordance with the embodiment shown in FIG. 24, where a GSM/EDGE PA and a WCDMA PA are each connected to independent supply lines associated with two linear regulators, where in FIG. 29A the switching regulator and each of the linear regulators are masters, and in FIG. 29B the linear regulators are each a master and the switching regulator is the slave (in the WCDMA mode only)
Figure 29B:
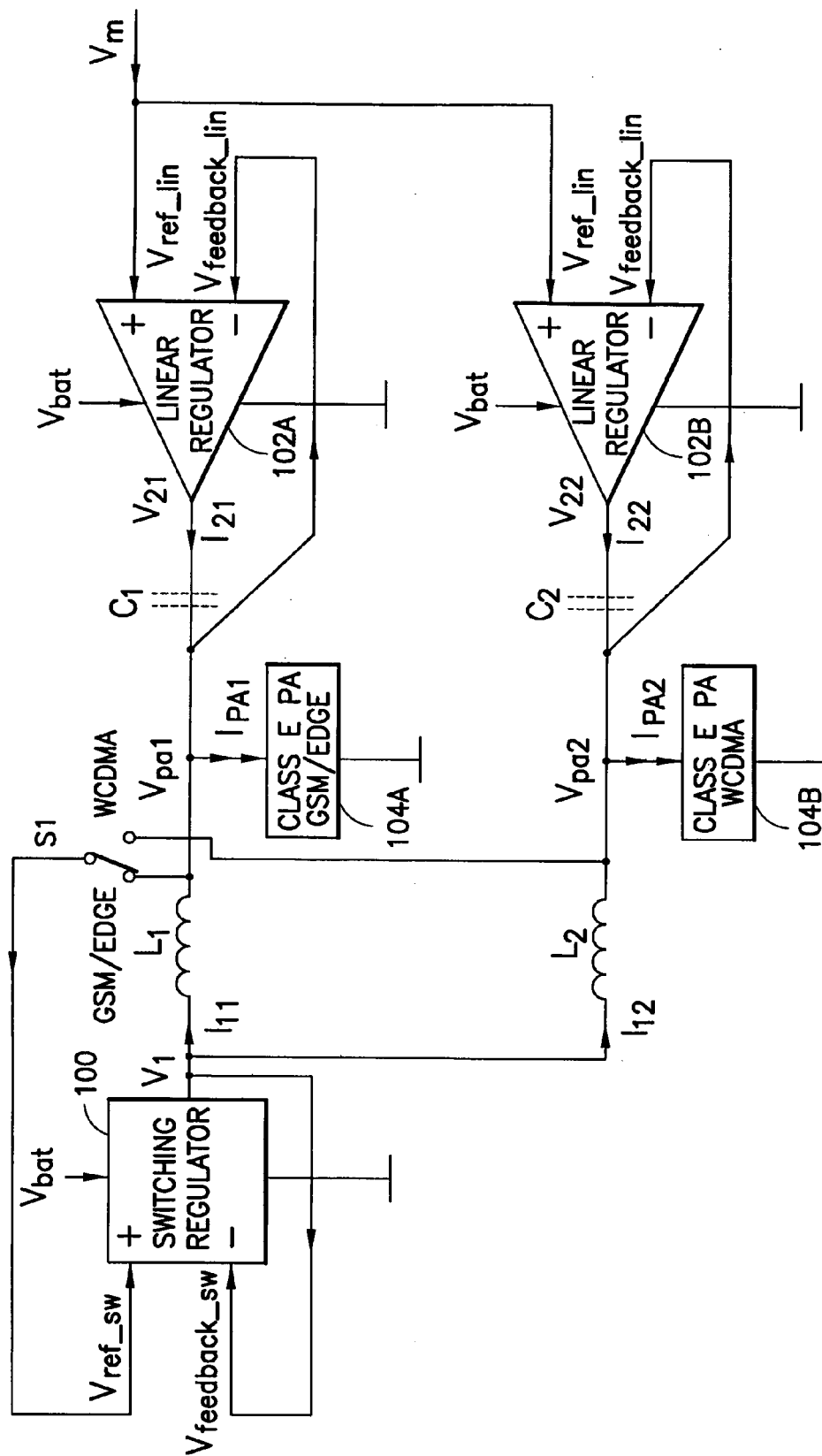

In FIG. 29A the switching regulator 100 and both linear regulators 102A, 102B are connected as 'masters', while in FIG. 29B the switching regulator 100 is connected as a 'slave', where its reference voltage is the output of the linear regulator 102A or 102B as selected by S1 according to the currently active system (GSM/EDGE or WCDMA).

FIG. 30 shows additional multi-mode configurations, where the GSM/EDGE PA 104A is connected at the output of the switching regulator 100 (between the output and $L_1$), and where the WCDMA PA 104B and a CDMA PA 104C are connected on independent supply lines at the output of individual linear regulators 102A, 102B, respectively. This embodiment may be considered as an extension of the multi-mode embodiments shown in FIGS. 27 and 29. This embodiment is particularly useful if the GSM/EDGE PA 104A can be connected directly to the output of the switching regulator 100, and if there are at least two other PAs that require fast supply voltage modulation and that can be placed on independent supply lines.

Figure 30A:
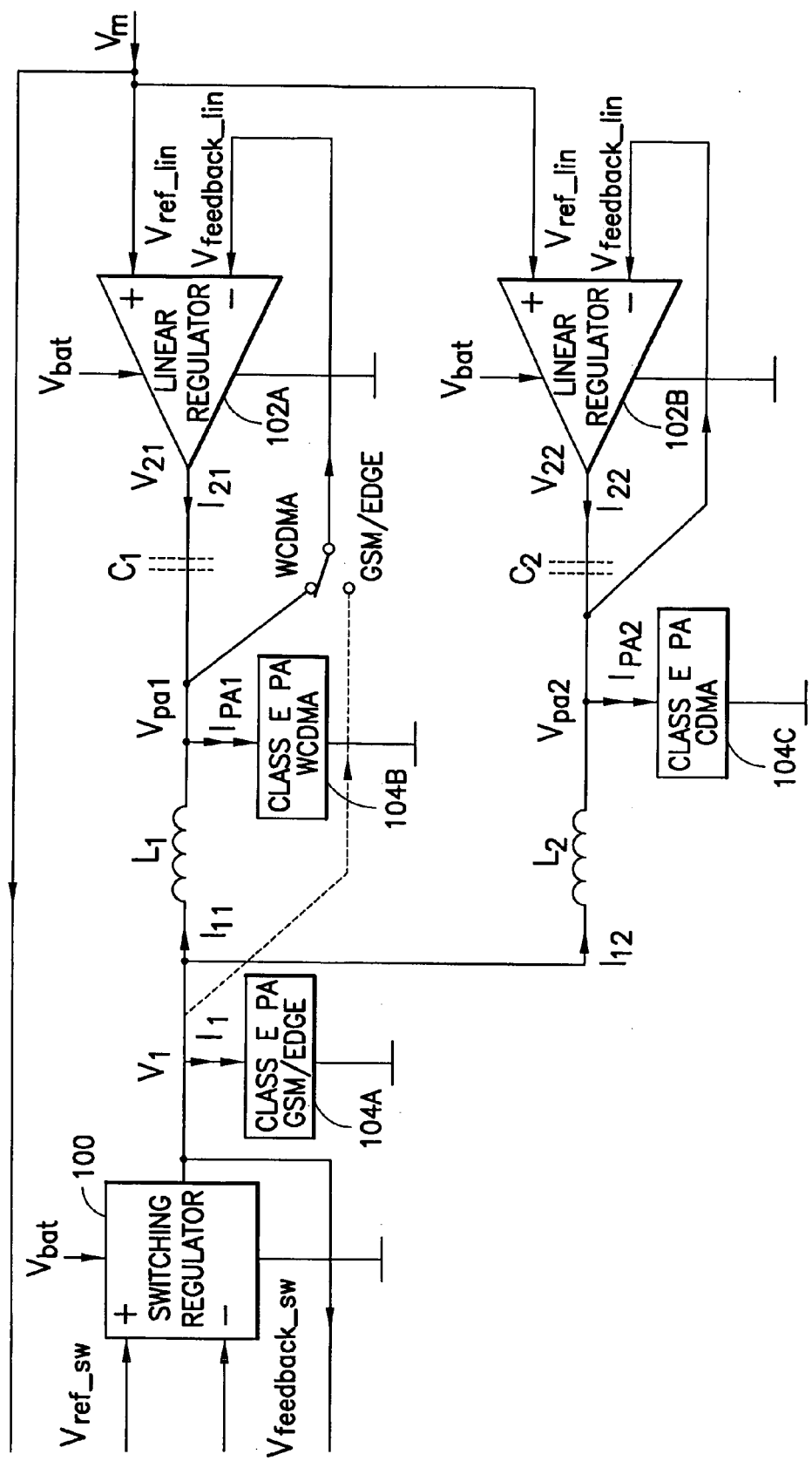
FIGS. 30A and 30B, collectively referred to as FIG. 30, show a fourth multi-mode control block diagram in accordance with the embodiment shown in FIG. 24, where a GSM/EDGE PA is connected to the output of the switching regulator, where a WCDMA PA and a CDMA PA are each connected to independent supply lines associated with two linear regulators, where in FIG. 30A the switching regulator and each of the linear regulators are masters, and in FIG. 30B the linear regulators are each a master and the switching regulator is the slave (in the WCDMA and CDMA modes only).
Figure 30B:
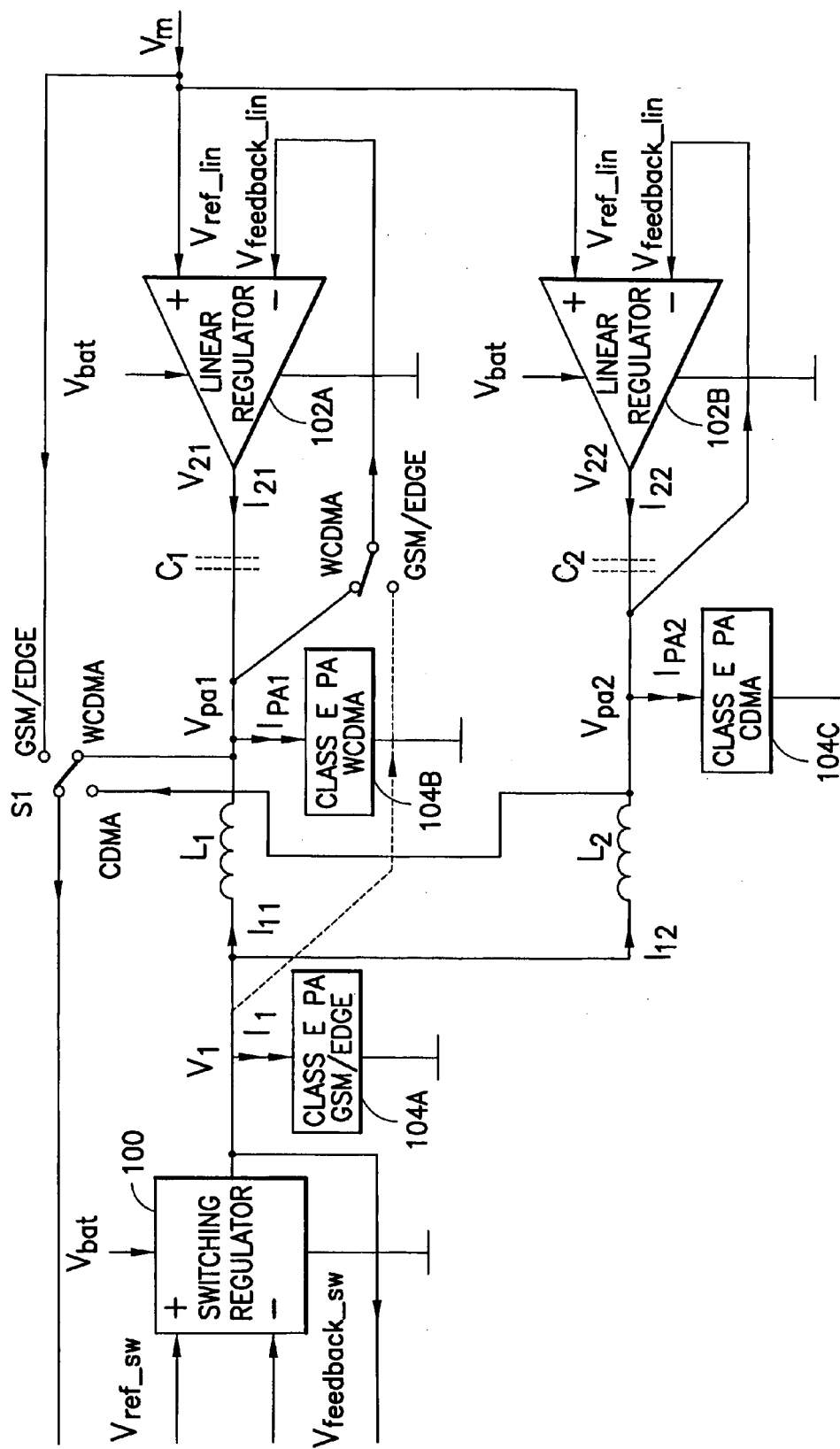

In FIG. 30A the switching regulator 100 and both linear regulators 102A, 102B are connected as 'masters', while in FIG. 30B the switching regulator 100 is connected as a 'slave' in only the WCDMA and CDMA modes of operation, where its reference voltage is the output of the linear regulator 102A or 102B as selected by the three pole switch S1 according to the currently active system (WCDMA or CDMA). In the GSM/EDGE mode the switching regulator 100 receives its $V_{ref\_sw}$ input, via S1, from the $V_m$ input, and thus functions as in FIG. 30A.

It should be appreciated that FIG. 21 shows a configuration where both the switching part 32 and the linear part 34 are 'masters', FIG. 22 shows a configuration where the linear part 34 is the 'master' and the switching part 32 is the 'slave', and FIG. 23 shows a configuration where both the switching part 32 and the linear part 34 are 'masters', and the switching part 32 operates open loop. In a further embodiment of this invention the switching part 32 may function as the 'master' and the linear part 34 as the 'slave'.

As the switching part 32 is relatively slow, it is preferred not too use its output $V_{pa}$ as the reference signal to 'slave' the linear part. With reference to FIG. 21, the signal $V_{ctrl\_sw}$ is in direct relationship with d, the duty-cycle of the PWM voltage applied to the LC filter at the pulse width modulator 32 node. In the steady state (constant $V_{ref\_sw}$), $V_{ctrl}$ is proportional with the output voltage $V_{pa}$. The situation is different, however, in the dynamic state (varying $V_{ref\_sw}$). If, for example, a fast increase in $V_{pa}$ is commanded through $V_{ref\_sw}$, the effect is a rapid increase in the error signal $V_{e1}$, a resulting rapid increase in $V_{ctrl\_sw}$, which at its turn commands an increase of the duty-cycle d. As a consequence of the increased duty-cycle, $V_{pa}$ eventually increases (slowly) to a new, higher level. Due to the LC filter, the response of the switching converter in increasing $V_{pa}$ is much slower than the response in increasing $V_{ctrl\_sw}$ and the related duty-cycle d. In other words, $V_{ctrl\_sw}$ contains information of what is to occur with the output voltage $V_{pa}$. An increase in $V_{ctrl\_sw}$ implies an increase in the duty-cycle d, hence it means that the output voltage $V_{pa}$ must increase. This information may be used to signal the linear part 34 to source current in order to aid in increasing $V_{pa}$. Relatedly, a decrease in $V_{ctrl\_sw}$ implies a decrease in the duty-cycle d, and hence it means that the output voltage $V_{pa}$ must decrease. This can be used to signal the linear part 34 to sink current to aid in decreasing $V_{pa}$. Thus, $V_{ctrl\_sw}$ contains valuable information, which can be used to 'slave' the linear stage 34.

With reference to the foregoing, this aspect of the invention provides yet another control mechanism wherein, as in FIG. 21, instead of $V_{ref\_lin}=V_m$, there is instead the relationship $V_{ref\_lin}=G_{c3}*V_{ctrl\_sw}$, where $G_{c3}(s)$ represents in a simplest case some amount of voltage scaling, and in a more complex case has also a frequency dependent characteristic. Assume as a non-limiting example that $G_{c3}(s)=1$. As mentioned above, in the steady-state (constant $V_{ref\_sw}$), $V_{ctrl\_sw}$ is proportional to the output voltage $V_{pa}$. Assume further for this non-limiting example that the proportionality constant is unity, so that $V_{pa}=V_{ctrl\_sw}$, and thus also that $V_{ref\_lin}=V_{ctrl\_sw}$, so that $V_{pa}=V_{ref\_lin}=>V_{e2}=0=>$no contribution from the linear part 34. If a fast increase in $V_{ref\_sw}$ is provided, this results in a fast increase in $V_{ctrl\_sw}$, as explained above, and thus also a fast increase in $V_{e2}$ results in a command to the linear part 34 to source additional current. Similarly, if a fast decrease in $V_{ref\_sw}$ is provided, this results in a fast decrease in $V_{ctrl\_sw}$ resulting in a fast decrease in $V_{e2}$, and the linear part 34 is thus commanded to sink current. Thus, in this manner the linear part 34 is essentially 'slaved' to the switching part 32.

Similar considerations apply in relation to the embodiment of FIG. 23, where the switching part 32 operates open loop, and also to the embodiments of FIG. 25A and the related FIGS. 26, 27, 29 and 30. In specific relation to FIG. 25A, the control configuration described above implies that, instead of $V_{ref\_lin}=V_m$, we have the relationship $V_{ref\_lin}=V_{ctrl\_sw}$. Note that while $V_{ctrl\_sw}$ is not shown in FIG. 25, $V_{ctrl\_sw}$ is assumed to be an internal signal to the switching regulator 100 block, which has the structure shown in, for example, FIG. 21, i.e., the switching part 32 in addition to the controls 36A and 36B.

It should be appreciated that these various embodiments of the invention allow the realization of an efficient PA power supply for a multi-mode transmitter architecture wherein the PA supply voltage may be amplitude modulated. Some advantages of the use of these embodiments include improved efficiency that leads to longer talk time and improved thermal management, and/or an ability to achieve a required bandwidth, and/or an ability to implement a multimode transmitter with one device (the prior assumption being that at least the GSM/EDGE and WCDMA cases should be provided with separate devices).

The use of the embodiments of this invention provides a number of advantages, including high power conversion efficiency. Relatedly, in battery-powered communications devices a longer talk time is provided. Thermal management issues are also more effectively managed, as compared to the use of the purely linear DC-DC converter, and there is also the potential to eliminate altogether, or a least reduce the size of, at least one power supply filtering capacitor (e.g., the capacitor C in FIG. 4A).

Figure 1A:
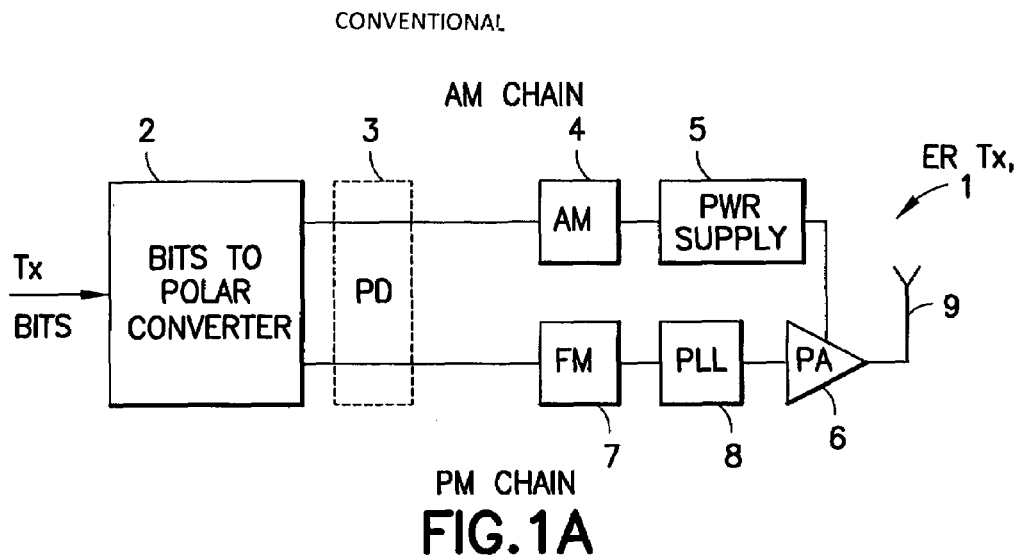
FIG. 1A is a block diagram of a conventional ER RF transmitter.
Figure 1B:
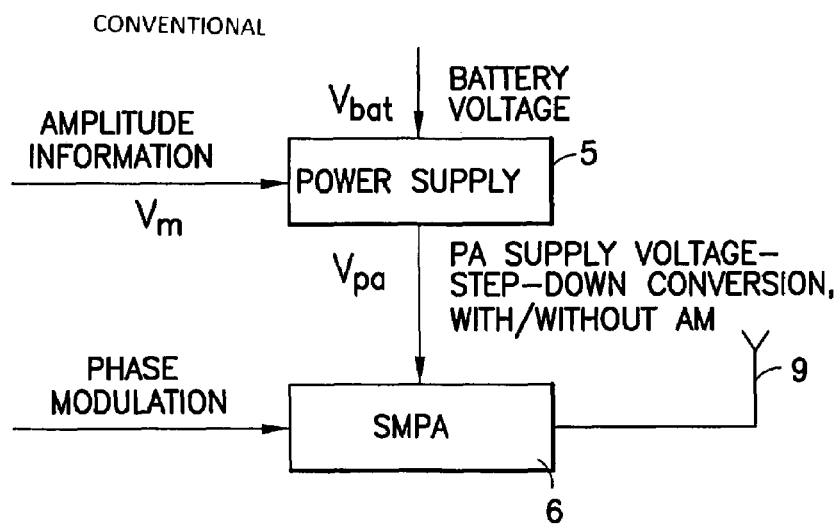
FIG. 1B is a block diagram of a conventional SMPA supplied with an amplitude modulated voltage by a power supply.
Figure 2:
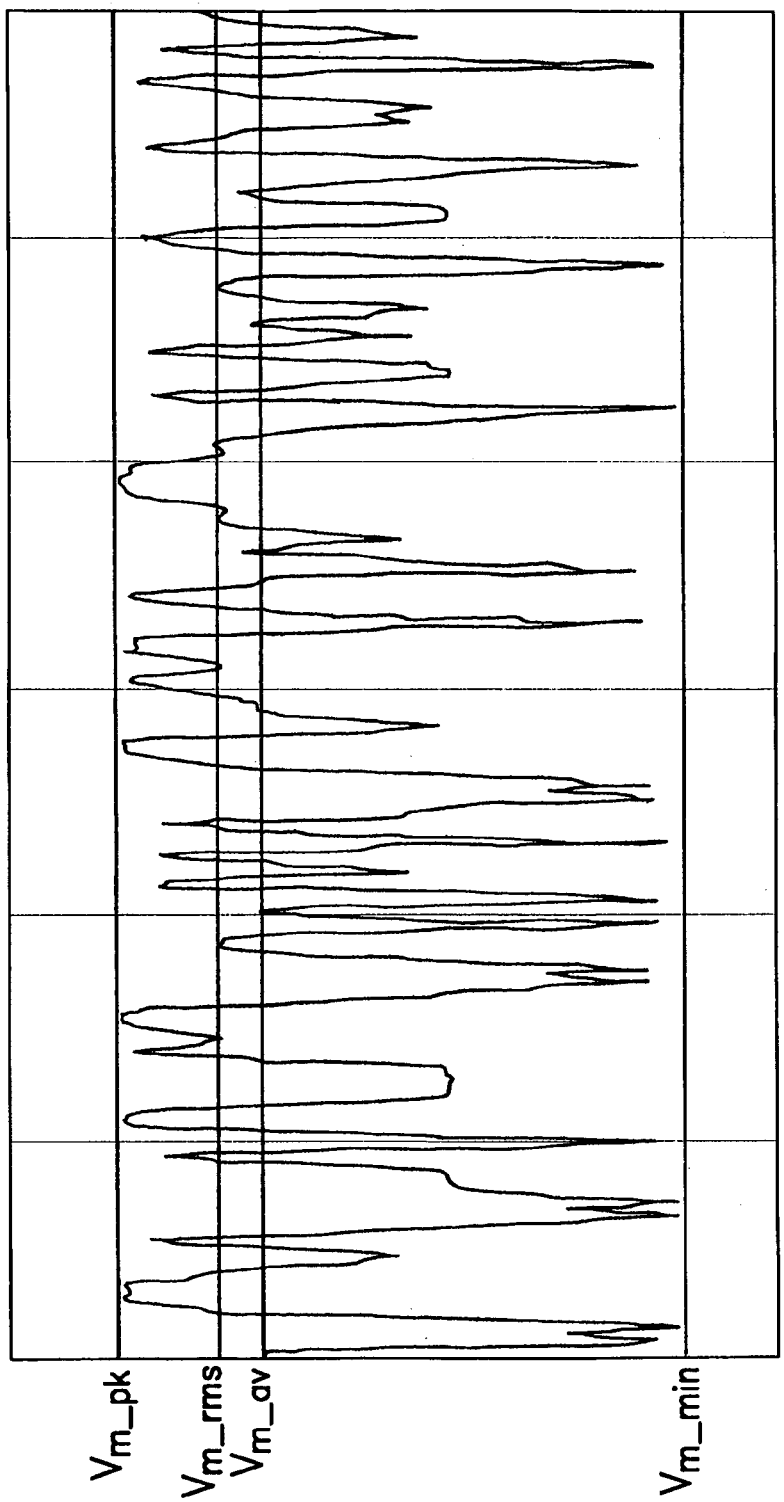
FIG. 2 is a waveform diagram showing a typical example of a reference voltage $V_m$ that must be tracked by the power supply of FIGS. 1A and 1B.

It is pointed out the conversion made in the switching part 32 or switching regulator 100 is described as step-down, and with voltage mode control, which is the presently preferred embodiment. However, it should be realized that the conversion could be step-up/step-down. Step-up/down is beneficial but it is more difficult to implement. Step-up/down enables lowering the cut-off voltage in the mobile station, such as a cellular telephone, as the battery voltage decreases as its charge is depleted, and the cut-off voltage is the minimum voltage for the mobile station to be operational. With too low a voltage the PA 6 is not able to produce full output power, and step-up/down solves this problem. For example, by the use of a step-up/down switching part 32 one may accommodate a $V_{bat}$ lower than $V_{m\_pk}$ (FIG. 2), whereas with only step-down $V_{bat}$ must be at least equal to $V_{m\_pk}$ plus some margin, e.g. $V_{m\_pk}$+0.2V. With fast AM modulation as shown in FIG. 2, the transition is controlled between the step-up and step-down characteristic in such a way that this transition does not cause distortion of the output voltage $V_{pa}$. Further, with a step-up/down switching part or converter, and when $V_{m\_pk}>V_{bat}$, the linear part 34 must be supplied from a DC source which is greater than $V_{m\_pk}$ and, hence, greater than $V_{bat}$ in order to be able to source current.

It can further be noted that in voltage mode control only voltage information (e.g. the output voltage of the converter) is used to generate the control signal. However, it is also possible to use also current mode control where, in addition to the voltage, current information is also used (e.g., the inductor current). In current mode control there are two control loops, one for current and one for voltage. Of course, other, more complex, types of controls may also be used.

In view of the foregoing description of the preferred embodiments of this invention, it should be realized that these teachings are not restricted for use with only GSM/EDGE, WCDMA and/or CDMA systems, but can be used to advantage in any type of system having a varying amplitude envelope, where the PA supply voltage should be modulated with high efficiency and high bandwidth.

In view of the foregoing description of the preferred embodiments of this invention, it should be realized that these teachings are not restricted for use with only Class E PAs, but in general can be applied to a number of SMPAs as well as normally linear PAs operated in saturation, such as the saturated Class B PA.

In view of the foregoing description of the preferred embodiments of this invention, it should be realized that these teachings are not restricted for use with any specific type of switching converter topology (e.g., not only Buck, not only step-down, but also step-up/down), and not with only voltage mode control.

In view of the foregoing description of the preferred embodiments of this invention, it should be realized that these teachings are not restricted for use with only a switching part that provides DC and a linear part that provides AC. In practice, it is desired that the switching part provides AC also, as much as possible (as it tries to follow the reference), and that the linear part provides the missing part of the AC (or the missing bandwidth). In this manner the embodiments of this invention enhance as much as possible the overall efficiency, as in principle the greater is the contribution from the switching part or converter, the greater is the efficiency.

In view of the foregoing description of the preferred embodiments of this invention, it should be realized that while the linear stage(s) compensate for the non-ideal dynamics of the switching stage, non-ideal dynamics are also partly caused by non-ideal PA behavior (e.g. load variations), in the sense that $R_{pa}$ changes with $V_{pa}$ (i.e., increases when $V_{pa}$ decreases) and in mismatch conditions. Thus, the linear stage(s) 34, 102 compensate at least for non-ideal dynamics of the switching converter (e.g., insufficient bandwidth and/or peaking in the reference-to-output characteristic). Further in this regard the linear stage(s) 34, 102 and the switching stage 32, 100 complement each other to obtain a specific desired reference-to-output transfer function (not only a specific bandwidth, but also a specific shape of the transfer function). For example, the linear stages 34, 102 may have such a reference-to-output transfer function that the resulting reference-to-output transfer function of the hybrid (switching/linear) power supply is or approximates a flat $2^{nd}$ order Butterworth filter type. Thus, the linear stage(s) 34, 102 can be used to shape the resulting overall reference-to-output transfer function in order to obtain the desired characteristic. The linear stage(s) 34, 102 also aid in tracking the reference signal, and can be used to obtain a specific desired tracking capability of the reference signal $V_m$. The linear stage(s) 34, 102 may also compensate at least for switching ripple, and may also compensate at least for non-ideal PA behavior, such as $R_{pa}$ variation with operating conditions.

It should be further understood that the auxiliary inductor $L_1$ introduced in FIG. 24 has, in practice, a similar role as the converter inductor L shown in FIG. 6 in that its effect is to create a current source characteristic. One distinction is that in the embodiments of FIG. 6, and those following, a PWM rectangular voltage is applied at the input of the inductor L, while in the embodiment of FIG. 24, and those following, an already smoothed voltage (the output of the switching converter 100) is applied to the input of the auxiliary inductor $L_1$.

In view of the foregoing description of the preferred embodiments of this invention, it should also be realized that in the GSM/GMSK modulation case the hybrid power supply performs a "power control" function, whereby the power level is adjusted by adjusting the voltage level with the power supply. As such, it can be appreciated that as opposed to AM control, what is used instead is "step control". Note that a goal may be to improve the PA 6 efficiency, particularly when using a linear PA. With the linear PA typically there will exist another mechanism to adjust the power level, even with constant supply voltage $V_{bat}$, but then the efficiency decreases at lower power levels and the DC level can be lowered to improve the efficiency. With the SMPA, however, the output power is controlled (mainly) by the supply voltage. As such, it is desirable to use the PA power supply 30 to control the power.

In any event, for the fast hybrid power supply 30 in accordance with the preferred embodiments of this invention, and for the GSM case: a) in the TX architecture the PA power supply is used to control the power; b) the PA power supply does not have to be very fast (while there are some requirements related to power ramp-up/down, they are less demanding than the EDGE case); and c) it is beneficial to compensate the switching ripple with the hybrid power supply 30, just as in the EDGE case.

The foregoing description has provided by way of exemplary and non-limiting examples a full and informative description of the best method and apparatus presently contemplated by the inventor for carrying out the invention. However, various modifications and adaptations may become apparent to those skilled in the relevant arts in view of the foregoing description, when read in conjunction with the accompanying drawings and the appended claims. For example, while the power supply of this invention has been described above in the context of a polar or ER transmitter embodiment, the invention can be applied other applications wherein a power supply must meet stringent dynamic requirements, while also exhibiting high efficiency. Further, the various embodiments of FIGS. 6-30 are not to be construed in a limiting sense upon the number of possible embodiments that the hybrid voltage regulator may assume, or of the types of RF power amplifiers and RF communication systems that the embodiments of this invention can be used with. In general, all such and similar modifications of the teachings of this invention will still fall within the scope of the embodiments of this invention.

Further still, some of the features of the present invention could be used to advantage without the corresponding use of other features. As such, the foregoing description should be considered as merely illustrative of the principles of the present invention, and not in limitation thereof.

What is claimed is:

1. A DC-DC converter, comprising:
   a switch mode part between a DC source and a load, the switch mode part is configured to provide x amount of output power; and
   a linear mode part in parallel with the switch mode part between the same or a different DC source and the load, the linear mode part configured to provide y amount of output power, where x is greater than y, and the ratio of x to y is optimized for particular application constraints, where the linear mode part exhibits a faster response time to a required change in output voltage than the switch mode part, where the linear mode part compensates at least in part for load variations, wherein the switch mode part is configured to be switchable between a slave mode controlled by the linear mode part and a master mode.

2. A DC-DC converter as in claim 1, where the linear mode part comprises at least one power operational amplifier operating as a variable voltage source.

3. A DC-DC converter as in claim 1, where the linear mode part comprises at least one power operational transconductance amplifier operating as a variable current source.

4. A DC-DC converter as in claim 1, where the linear mode part provides only an AC component to the load.

5. A DC-DC converter as in claim 1, where the linear mode part provides a DC component and an AC component to the load.

6. A DC-DC converter as in claim 1, where the output of the linear mode part compensates for AC ripple output from the switch mode part.

7. A DC-DC converter as in claim 1, where the linear mode part comprises a bi-directional voltage controlled voltage source.

8. A DC-DC converter as in claim 1, where the linear mode part comprises a bi-directional voltage controlled voltage source (VCVS), and comprises two VCVS circuits, where in operation one operates as a sink and one as a source.

9. A DC-DC converter as in claim 1, where the linear mode part comprises a bi-directional voltage controlled current source.

10. A DC-DC converter as in claim 1, where the linear mode part comprises a bi-directional voltage controlled current source (VCCS), and comprises two VCCS circuits, where one operates as a sink and one as a source.

11. A DC-DC converter as in claim 1, where, when the switch mode part is in the master mode, the switch mode part and the linear mode part are controlled in common by a control signal in a closed-loop manner.

12. A DC-DC converter as in claim 11, where the load comprises at least one radio frequency (RF) power amplifier, and where the control signal comprises a RF carrier modulation signal.

13. A DC-DC converter as in claim 1, where, when the switch mode part is in the slave mode, the switch mode part is controlled by an output from the linear mode part in a closed-loop manner, and where the linear mode part is controlled by a control signal in a closed-loop manner.

14. A DC-DC converter as in claim 13, where the load comprises at least one radio frequency (RF) power amplifier, and where the control signal comprises a RF carrier modulation signal.

15. A DC-DC converter as in claim 1, where the switch mode part is operated open-loop, and where the linear mode part is controlled by a control signal in a closed-loop manner.

16. A DC-DC converter as in claim 15, where the load comprises at least one radio frequency (RF) power amplifier, and where the control signal comprises a RF carrier modulation signal.

17. A DC-DC converter as in claim 1, where the linear mode part is effectively slaved to operation of the switch mode part to source or sink current.

18. A DC-DC converter as in claim 1, where the switch mode part is provided with minimal or no output filter capacitance to function substantially as a current source.

19. A DC-DC converter as in claim 1, where the switch mode part is provided with an output filter capacitance and functions substantially as a voltage source.

20. A DC-DC converter as in claim 1, where the switch mode part is coupled to the load and to the output of the linear mode part through an inductance.

21. A DC-DC converter as in claim 1, where the load comprises at least one radio frequency power amplifier.

22. A DC-DC converter as in claim 1, where the linear mode part is coupled to the output of the switch mode part and to the load through a capacitance.

23. A DC-DC converter as in claim 1, where the linear mode part compensates at least in part for non-ideal dynamics of the switch mode part.

24. A DC-DC converter, comprising:
   a switch mode part between a DC source and a load, the switch mode part is configured to provide x amount of output power; and
   a linear mode part in parallel with the switch mode part between the same or a different DC source and the load, the linear mode part configured to provide v amount of output power, where x is greater than y, and the ratio of x to y is optimized for particular application constraints, where the linear mode part exhibits a faster response time to a required change in output voltage than the switch mode part, where the linear mode part compensates at least in part for load variations, where the switch mode part is coupled to the load and to the output of the linear mode part through an inductance, and where the linear mode part is coupled to the output of the switch mode part, via the inductance, and to the load through a capacitance.

* * * * *

UNITED STATES PATENT AND TRADEMARK OFFICE
CERTIFICATE OF CORRECTION

PATENT NO. : 7,653,366 B2  Page 1 of 1
APPLICATION NO. : 11/399118
DATED : January 26, 2010
INVENTOR(S) : Grigore It is certified that error appears in the above-identified patent and that said Letters Patent is hereby corrected as shown below:

Claim 24, col. 22, line 54 delete "v" and insert --y--.

Signed and Sealed this

Thirtieth Day of March, 2010

David J. Kappos
*Director of the United States Patent and Trademark Office*